United States Patent
Chuang

(10) Patent No.: US 12,154,821 B2
(45) Date of Patent: Nov. 26, 2024

(54) METHOD OF MANUFACTURING SEMICONDUCTOR DEVICE INCLUDING ISOLATION STRUCTURE WITH NITRIDATION LAYER

(71) Applicant: NANYA TECHNOLOGY CORPORATION, New Taipei (TW)

(72) Inventor: Ying-Cheng Chuang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 192 days.

(21) Appl. No.: 17/849,986

(22) Filed: Jun. 27, 2022

(65) Prior Publication Data

US 2023/0420290 A1    Dec. 28, 2023

(51) Int. Cl.
*H01L 21/762* (2006.01)
*H01L 21/02* (2006.01)

(52) U.S. Cl.
CPC .... *H01L 21/76229* (2013.01); *H01L 21/0214* (2013.01); *H01L 21/0217* (2013.01); *H01L 21/02238* (2013.01); *H01L 21/02247* (2013.01); *H01L 21/02252* (2013.01); *H01L 21/02255* (2013.01)

(58) Field of Classification Search
CPC .......... H01L 21/76229; H01L 21/0214; H01L 21/0217; H01L 21/02238; H01L 21/02247; H01L 21/02252; H01L 21/02255; H01L 21/76224
See application file for complete search history.

(56) References Cited

U.S. PATENT DOCUMENTS

| | | | |
|---|---|---|---|
| 5,447,884 A | 9/1995 | Fahey et al. | |
| 5,712,185 A | 1/1998 | Tsai et al. | |
| 5,763,315 A | 6/1998 | Benedict et al. | |
| 7,482,246 B2 | 1/2009 | Eun | |
| 7,923,363 B2 | 4/2011 | Goarin et al. | |
| 2013/0140669 A1* | 6/2013 | Yugami | H01L 21/76283 438/424 |
| 2016/0064290 A1* | 3/2016 | Xu | H01L 21/02323 257/369 |
| 2018/0350904 A1* | 12/2018 | Nagai | H01L 21/76224 |

FOREIGN PATENT DOCUMENTS

TW    200727390    7/2007

OTHER PUBLICATIONS

Taiwanese Office Action dated Jun. 6, 2023 in application No. 11220551310, the search report attached to the Office Action; pp. 1-6.

* cited by examiner

*Primary Examiner* — Julia Slutsker
(74) *Attorney, Agent, or Firm* — Muncy, Geissler, Olds & Lowe, P.C.

(57) ABSTRACT

A method of manufacturing a semiconductor device is provided. The method includes providing a substrate. The method also includes forming a first trench within the substrate. The method further includes forming a first nitridation layer within the first trench. In addition, the method includes forming a first isolation layer on the first nitridation layer to form a first isolation structure.

9 Claims, 25 Drawing Sheets

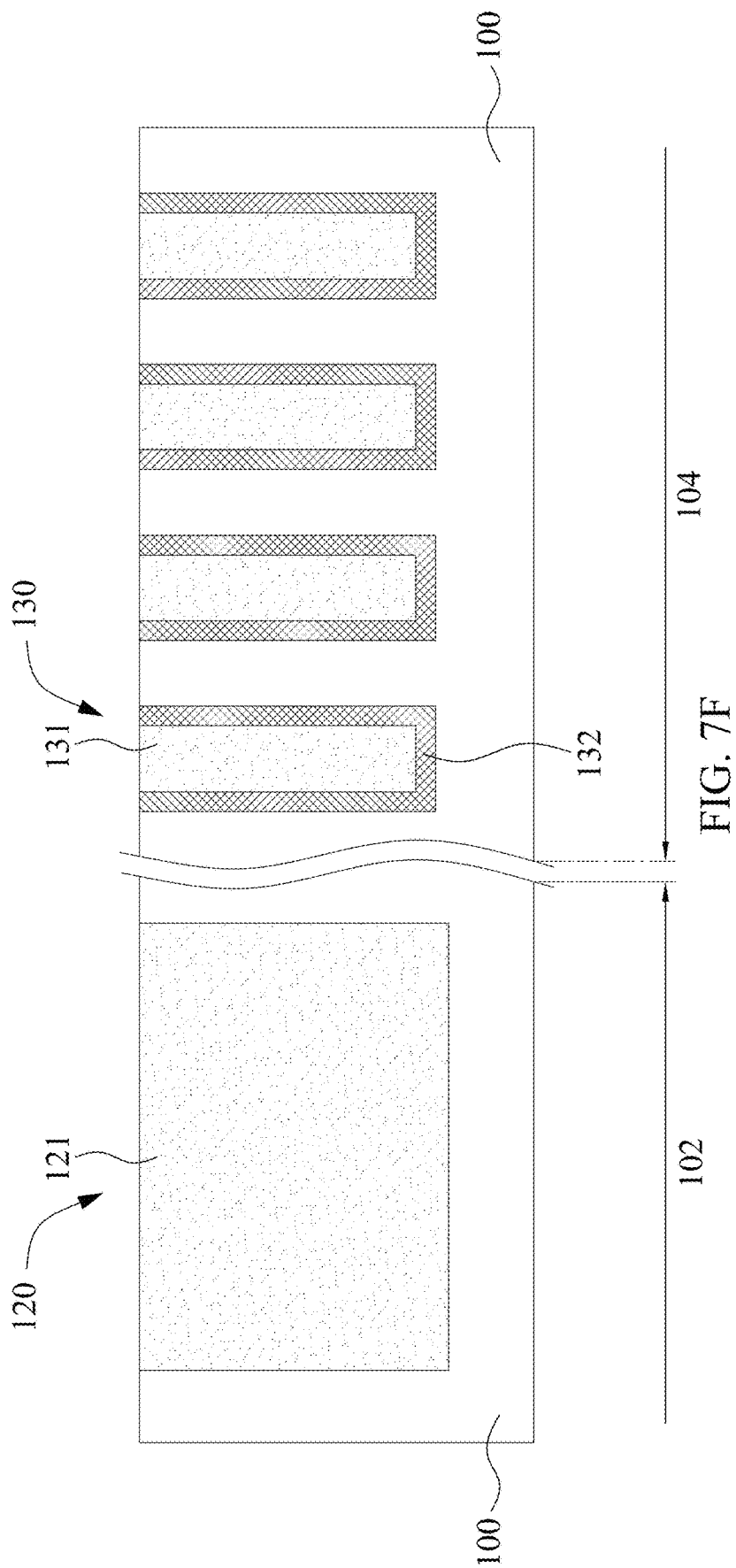

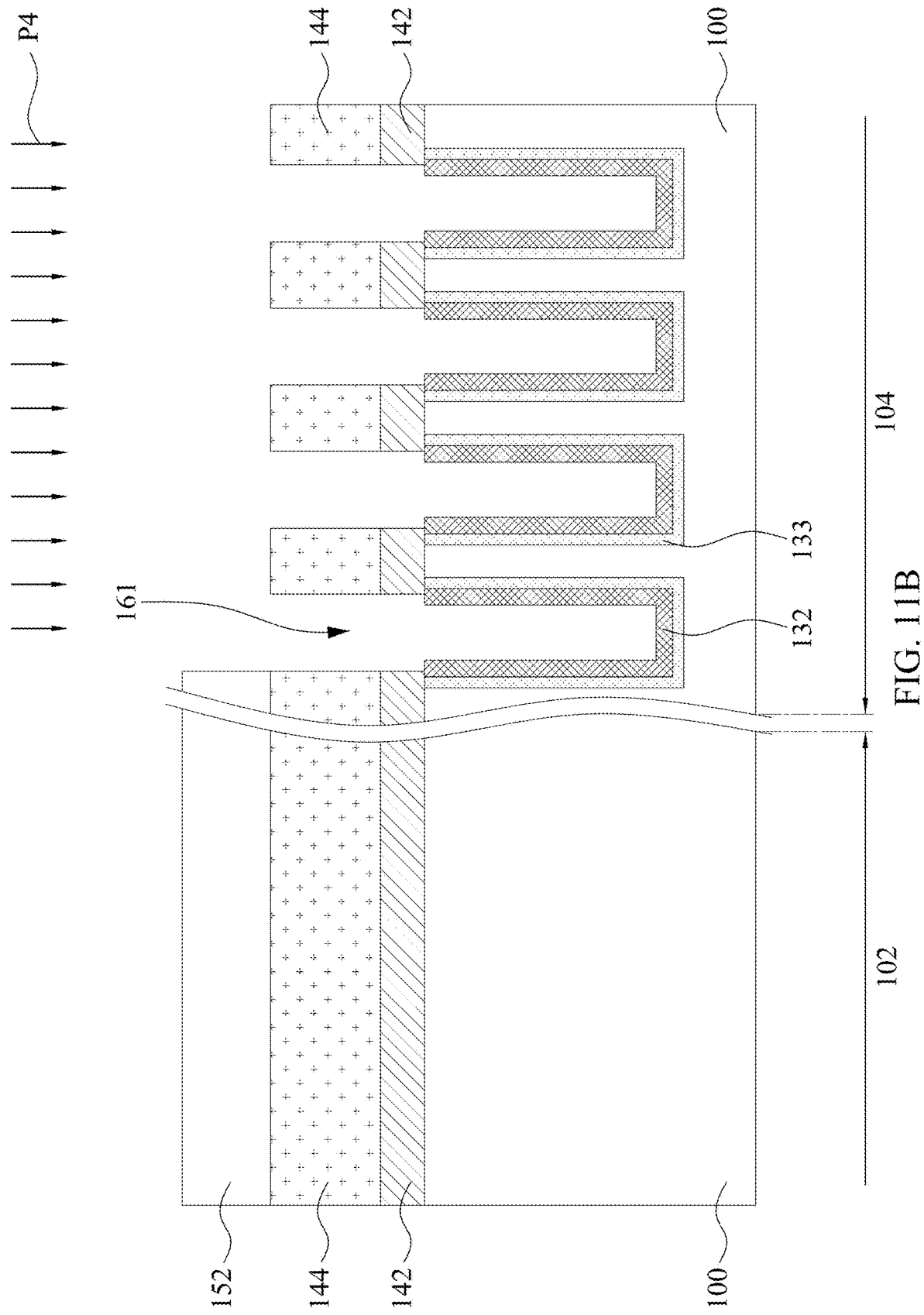

METHOD OF MANUFACTURING SEMICONDUCTOR DEVICE INCLUDING ISOLATION STRUCTURE WITH NITRIDATION LAYER

TECHNICAL FIELD

The present disclosure relates to a method for manufacturing a semiconductor device, and more particularly, to a method for manufacturing a semiconductor device including an isolation structure with a nitridation layer therein.

DISCUSSION OF THE BACKGROUND

With the rapid growth of the electronics industry, the development of integrated circuits (ICs) has achieved high performance and miniaturization. Technological advances in IC materials and design have produced generations of ICs in which each generation has smaller and more complex circuits than the previous generation.

A memory device (e.g., dynamic random access memory (DRAM)) is a type of random access memory that stores each bit of data in a separate capacitor within an integrated circuit. Typically, DRAM is arranged in a square array of one capacitor and transistor per cell. A vertical transistor has been developed for the $4F^2$ DRAM cell, where F stands for the photolithographic minimum feature width or critical dimension (CD). However, recently DRAM manufacturers face a tremendous challenge in reduction of memory cell area as the isolation structure (such as shallow trench isolation) spacing continues to be reduced. For example, relatively long retention time can improve performance of a memory device.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate, a first isolation structure, and a second isolation structure. The substrate has a first region and a second region. The first isolation structure is disposed within the first region of the substrate. The first isolation structure includes a first dielectric layer and a first nitridation layer disposed between the substrate and the first dielectric layer. The second isolation structure is disposed within the second region of the substrate.

Another aspect of the present disclosure provides a semiconductor device. The semiconductor device includes a substrate, a first isolation structure, and a second isolation structure. The substrate has a first region and a second region. The first isolation structure is disposed within the first region of the substrate. The second isolation structure is disposed within the second region of the substrate. A first composition of the first isolation structure is different from a second composition of the second isolation structure.

Another aspect of the present disclosure provides a method of manufacturing a semiconductor device. The method includes providing a substrate. The method also includes forming a first trench within the substrate. The method further includes forming a first nitridation layer within the first trench. In addition, the method includes forming a first isolation layer on the first nitridation layer to form a first isolation structure.

The embodiments of the present disclosure provide a semiconductor device. The substrate may be nitrified before an isolation layer is formed within a trench. The nitrified substrate may assist in improving the retention time of the semiconductor device, especially where the semiconductor device includes a memory.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It can also be appreciated by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 7F illustrates one or more stages of an exemplary method for manufacturing a semiconductor device according to some embodiments of the present disclosure.

FIG. 11B illustrates one or more stages of an exemplary method for manufacturing a semiconductor device according to some embodiments of the present disclosure.

DETAILED DESCRIPTION

Figure 1A:
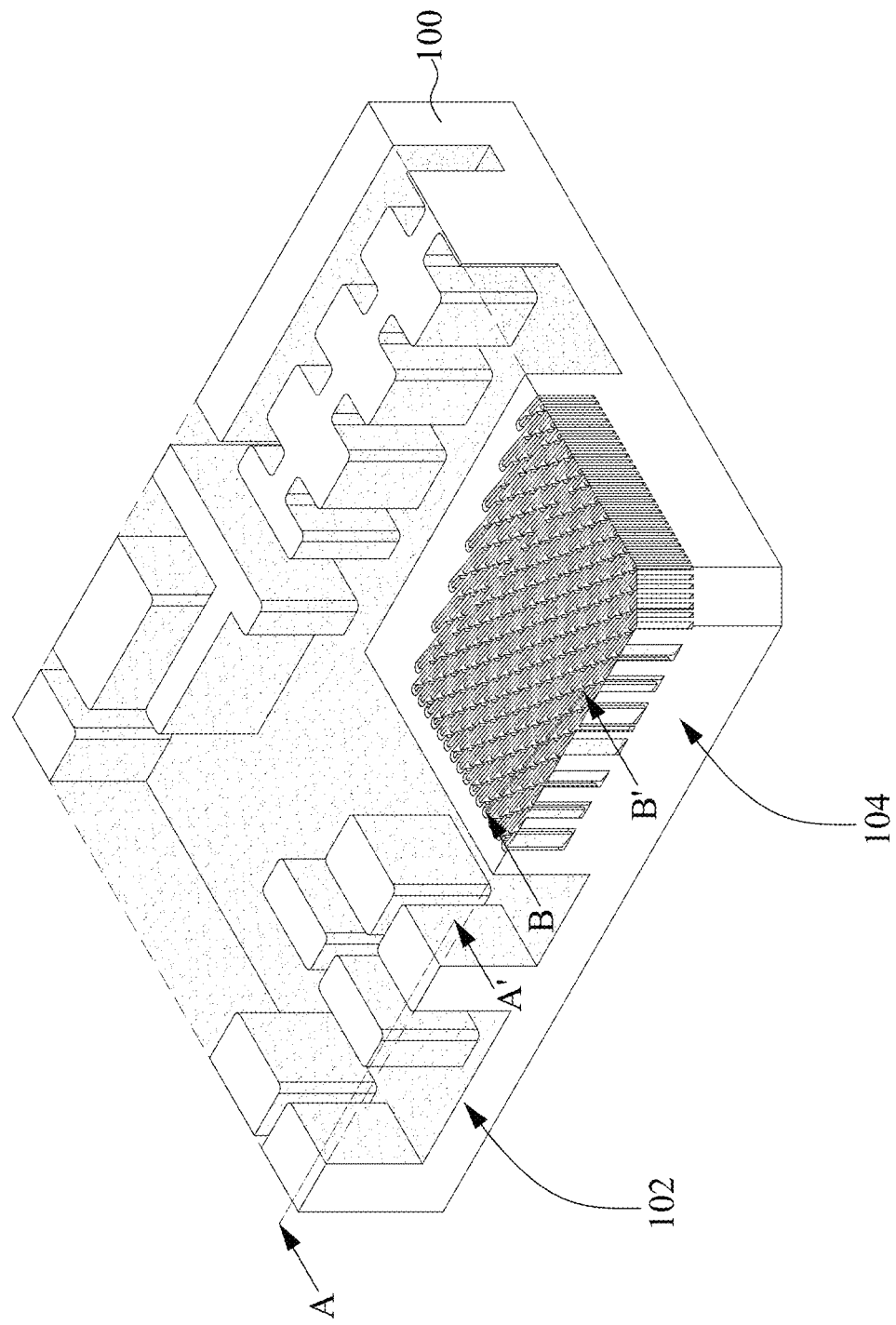
FIG. 1A is a perspective view of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1A is a perspective view of a semiconductor device 1a, in accordance with some embodiments of the present disclosure.

In some embodiments, the semiconductor device 1a may include a substrate 100.

The substrate 10 may be a semiconductor substrate, such as a bulk semiconductor, a semiconductor-on-insulator (SOI) substrate, or the like. The substrate 10 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials, or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 10 may be multilayered, or the substrate 10 may include a multilayered compound semiconductor structure.

The substrate 100 may include a peripheral region 102 and an array region 104. In some embodiments, the peripheral region 102 may be utilized to form a logic device. The logic device may include a system-on-a-chip (SoC), a central processing unit (CPU), a graphics processing unit (GPU), an application processor (AP), a microcontroller, a radio frequency (RF) device, a sensor device, a micro-electro-mechanical-system (MEMS) device, a digital signal processing (DSP) device, a front-end device, an analog front-end (AFE) device, or other devices.

The array region 104 may be utilized to form a memory device. The memory device can include, for example, a dynamic random access memory (DRAM) device, a one-time programming (OTP) memory device, a static random access memory (SRAM) device, or other suitable memory devices.

Figure 1B:
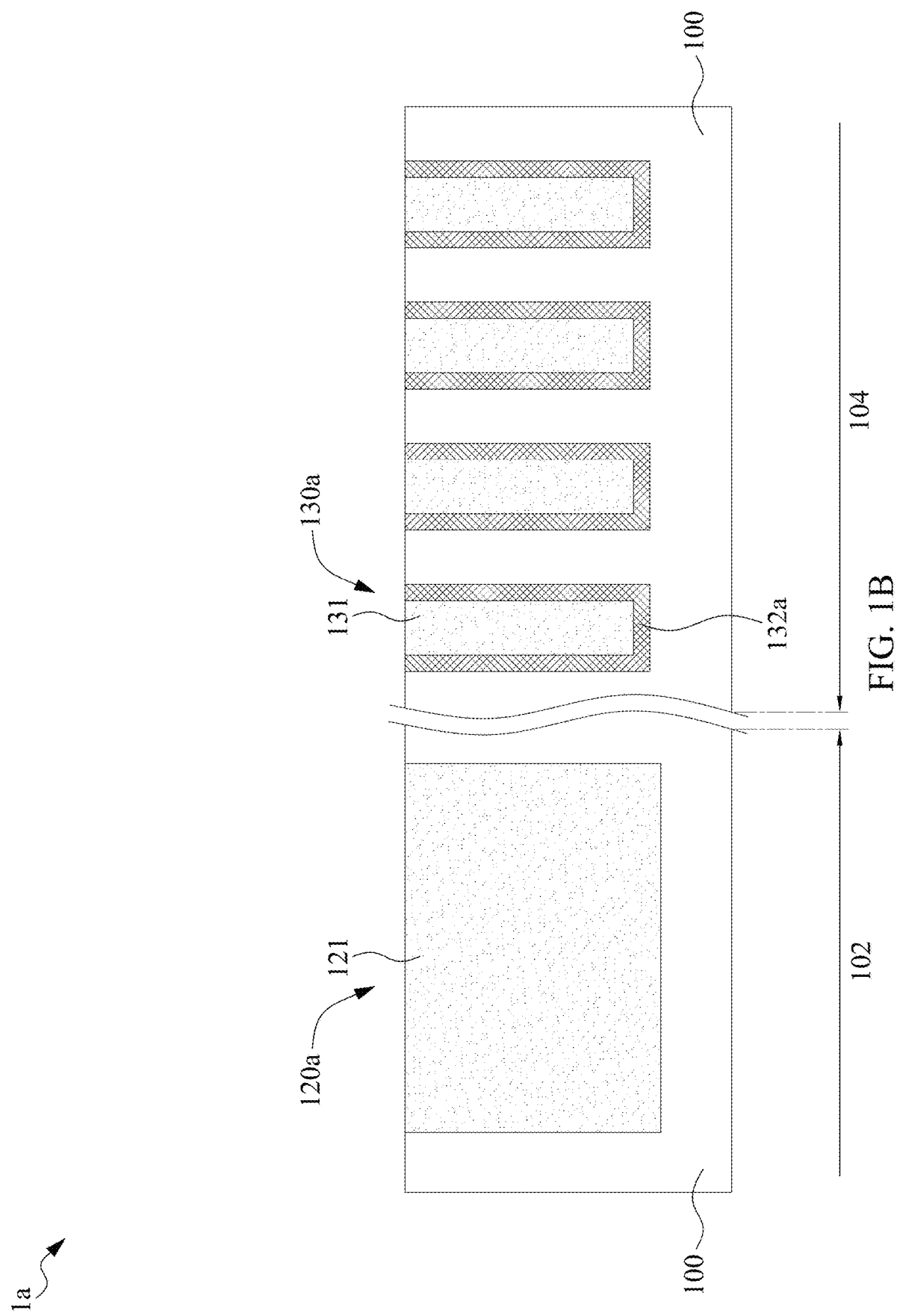
FIG. 1B is a cross-sectional view of a peripheral region and an array region of the semiconductor device as shown in FIG. 1A, in accordance with some embodiments of the present disclosure.

FIG. 1B is a cross-sectional view of the peripheral region 102 and array region 104 of the semiconductor device 1a as shown in FIG. 1A, in accordance with some embodiments of the present disclosure. For example, the peripheral region 102 as shown in FIG. 1B may be a cross-section along line A-A' of FIG. 1A, and array region 104 as shown in FIG. 1B may be a cross-section along line B-B' of FIG. 1A.

In some embodiments, the semiconductor device 1a may include an isolation structure 120a and an isolation structure 130a. The isolation structures 120a and/or 130a may include, for example, a shallow trench isolation (STI).

The isolation structure 120a may be disposed within the peripheral region 102. The isolation structure 130a may be disposed within the array region 104. In some embodiments, the isolation structure 120a may have dimensions different from the isolation structure 130a. In some embodiments, the isolation structure 120a may have a width different from that of the isolation structure 130a. For example, the width of the isolation structure 120a may exceed that of the isolation structure 130a. In some embodiments, the isolation structure 120a may have a depth different from that of the isolation structure 130a, For example, the depth of the isolation structure 120a may exceed that of the isolation structure 130a. In some embodiments, the isolation structure 120a may have an aspect ratio different from that of the isolation structure 130a. For example, the aspect ratio of the isolation structure 120a may be less than the aspect ratio of the isolation structure 130a.

In some embodiments, the isolation structure 120a may include an isolation layer 121. In some embodiments, the isolation layer 121 may include a dielectric material, such as silicon oxide, fluoride-doped silicate glass (FSG), a low-K dielectric material, another suitable material, or a combination thereof, in accordance with some embodiments. In some embodiments, the isolation layer 121 may be free of nitrogen.

In some embodiments, the isolation structure 130a may include an isolation layer 131. In some embodiments, the isolation layer 131 may include a dielectric material, such as silicon oxide, silicon nitride, silicon oxynitride, fluoride-doped silicate glass, a low-K dielectric material, another suitable material, or a combination thereof, in accordance with some embodiments.

In some embodiments, the isolation structure 130a may include a nitridation layer 132a. In some embodiments, the nitridation layer 132a may be disposed between the substrate 100 and the isolation layer 131. In some embodiments, the nitridation layer 132a may contact the substrate 100. In some embodiments, the nitridation layer 132a may contact the isolation layer 131. In some embodiments, the nitridation layer 132a may include or be made of $Si_xN_z$, wherein X exceeds 0, and Z exceeds 0.

In some embodiments, nitrogen or nitride within the substrate 100 may be detected by energy-dispersive X-ray spectroscopy or other suitable techniques.

In this embodiment, the array region 104 of the substrate 100 may be nitrified. As a result, a nitridation layer 132 may be formed between the substrate 100 and the isolation layer 131, which may assist in improving the retention time of the semiconductor device 1a.

Figure 2:
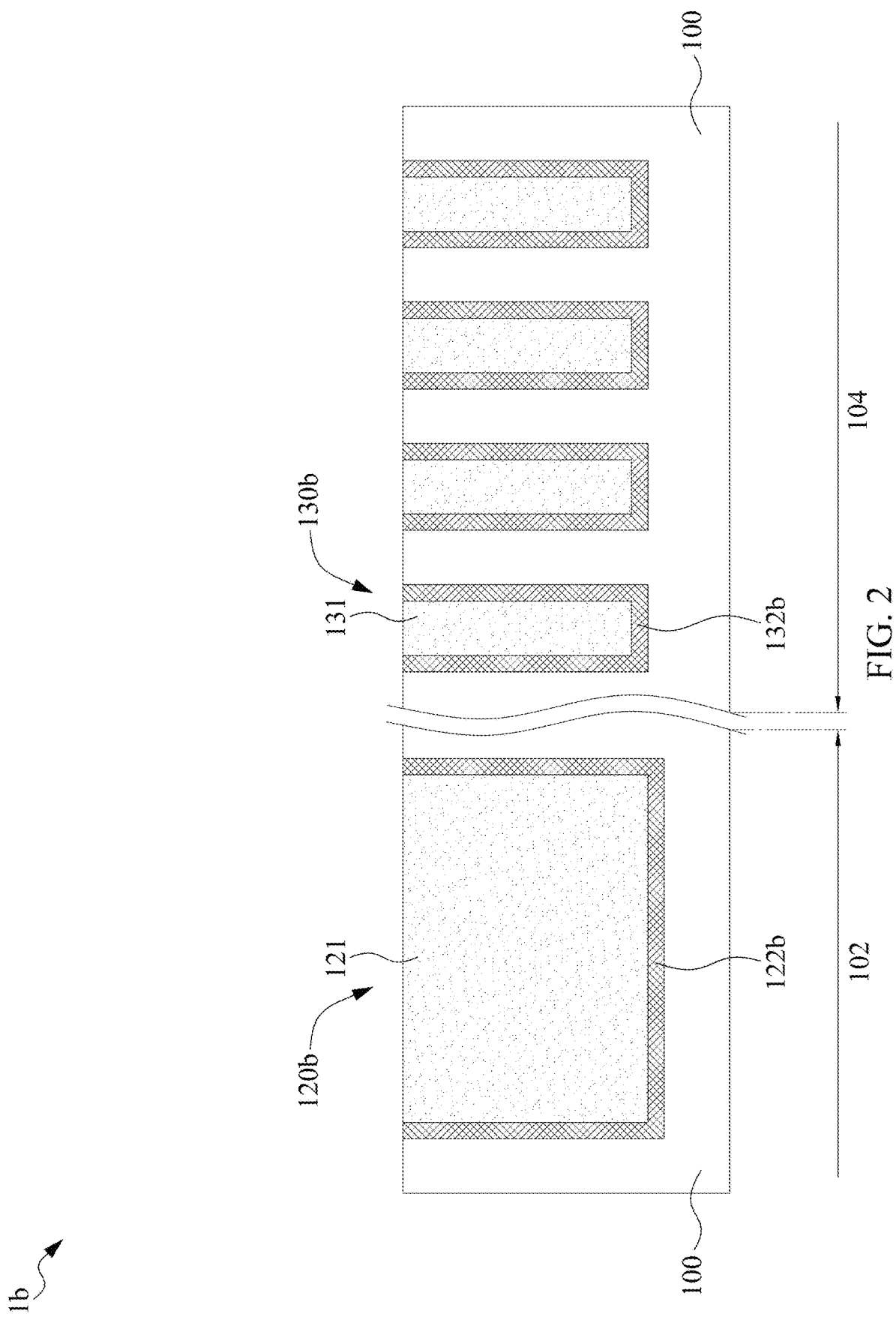
FIG. 2 is a cross-sectional view of a semiconductor device, in accordance with some embodiments of the present disclosure.

FIG. 2 is a cross-sectional of a semiconductor device 1b, in accordance with some embodiments of the present disclosure. The semiconductor device 1b is similar to the semiconductor device 1a, with differences therebetween as follows.

In some embodiments, the semiconductor device 1b may include an isolation structure 120b and an isolation structure 130b. In some embodiments, the structure and/or composition of the isolation structure 130b may be the same as those of the isolation structure 130a. The isolation structure 130 may include a nitridation layer 132b. The structure and/or composition of the nitridation layer 132b may be the same as those of the nitridation layer 132a.

In some embodiments, the isolation structure 120b may include a nitridation layer 122b. In some embodiments, the nitridation layer 122b may be disposed between the substrate 100 and the isolation layer 121, In some embodiments, the nitridation layer 122b may contact the substrate 100. In some embodiments, the nitridation layer 122b may contact the isolation layer 121. In some embodiments, the nitridation layer 122b may include or be made of $Si_xN_z$, wherein X exceeds 0, and Z exceeds 0.

Figure 3:
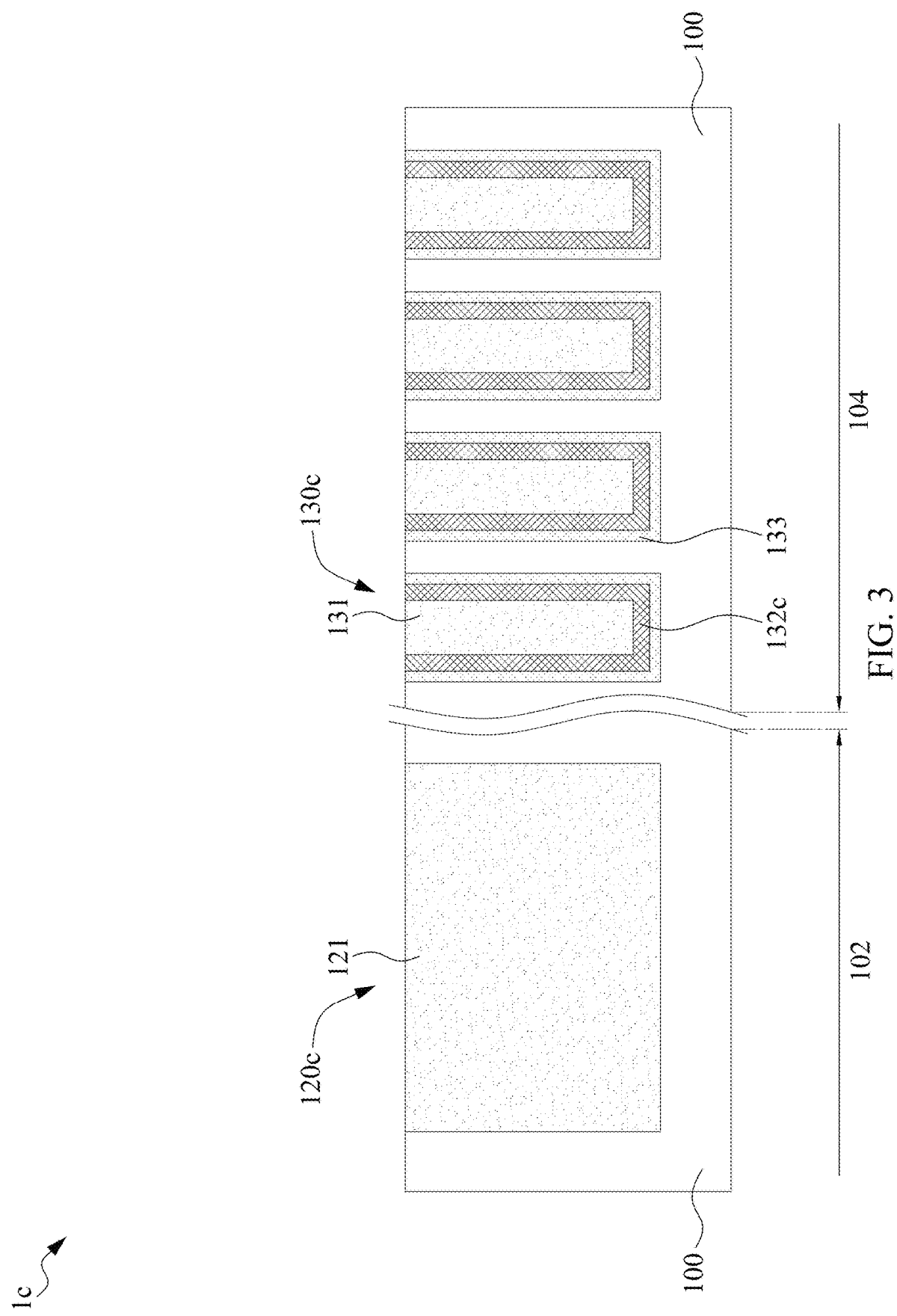
FIG. 3 is a cross-sectional view of a semiconductor device, in accordance with some embodiments of the present disclosure.

FIG. 3 is a cross-section of a semiconductor device 1c, in accordance with some embodiments of the present disclosure. The semiconductor device 1c is similar to the semiconductor device 1a, with differences therebetween as follows.

In some embodiments, the semiconductor device 1c may include an isolation structure 120c and an isolation structure 130c. In some embodiments, the structure and/or composition of the isolation structure 120c may be the same as those of the isolation structure 120a.

In some embodiments, the isolation structure 130; may include an oxidation layer 133 in some embodiments, the oxidation layer 133 may contact the substrate 100. In some embodiments, the oxidation layer 133 may be spaced apart from the isolation layer 131. In some embodiments, the oxidation layer 133 may include silicon oxide.

In some embodiments, the isolation structure 130c may include a nitridation layer 132c. In some embodiments, the nitridation layer 132c may be disposed between the isolation layer 131 and the oxidation layer 133. In some embodiments, the oxidation layer 133 may contact the nitridation layer 132c. In some embodiments, the nitridation layer 132c may be spaced apart from the substrate 100. In some embodiments, the nitridation layer 132c may include or be made of $Si_xO_yN_z$, wherein X exceeds 0, Y exceeds 0, and Z exceeds 0.

In some embodiments, nitrogen or nitride (oxygen or oxide) within the substrate 100 may be detected by energy-dispersive X-ray spectroscopy or other suitable techniques.

The oxidation layer 133 may serve as a buffer layer between the substrate 100 and the nitridation layer 132c, thereby reducing defects generated between the substrate 100 and the nitridation layer 132c, In this embodiment, the nitridation layer (e.g., nitridation layer 132c) may assist in improving the retention time of the semiconductor device 1c.

Figure 4:
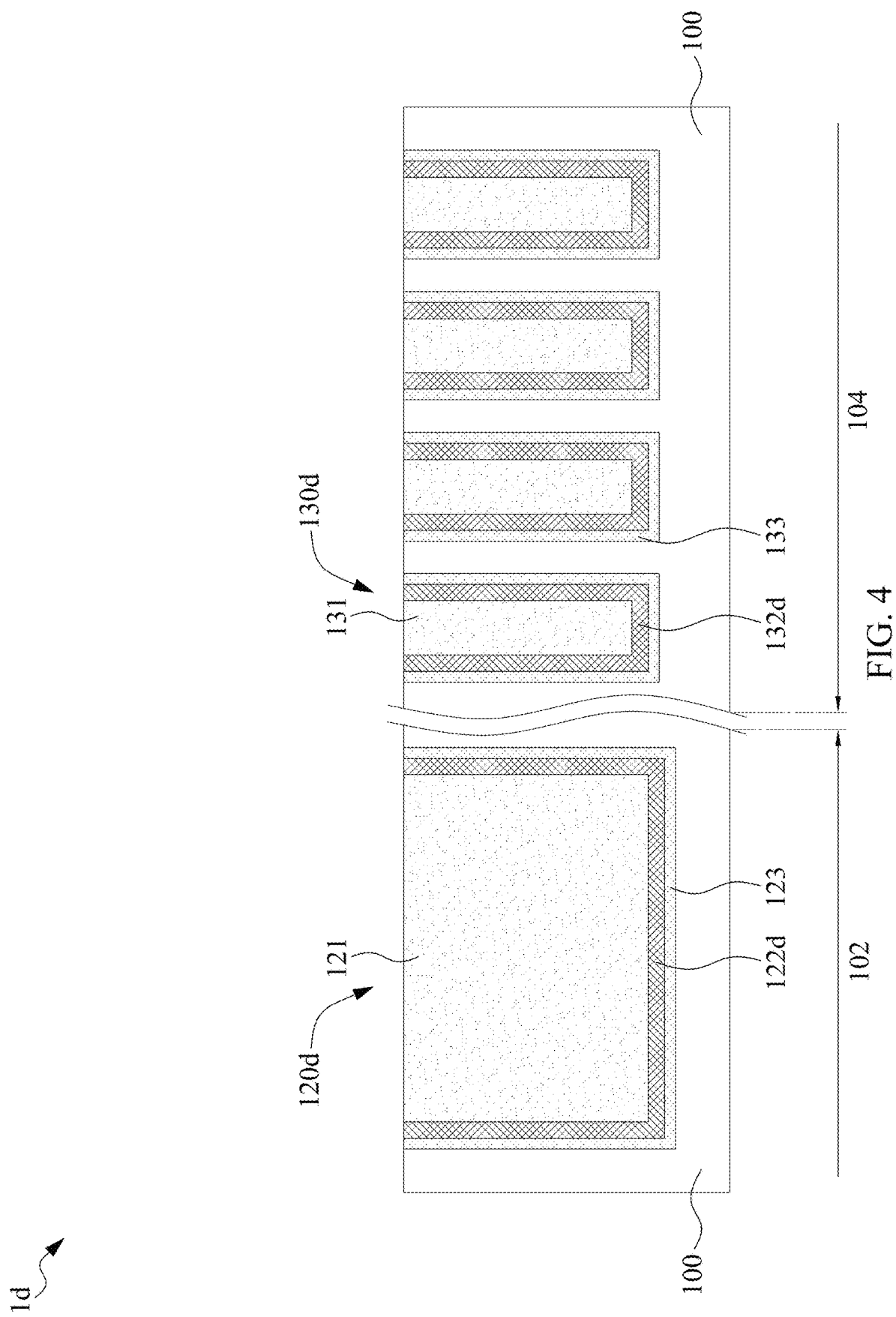
FIG. 4 is a cross-sectional view of a semiconductor device, in accordance with some embodiments of the present disclosure.

FIG. 4 is a cross-section of a semiconductor device 1d, in accordance with some embodiments of the present disclosure. The semiconductor device 1d is similar to the semiconductor device 1c, with differences therebetween as follows.

In some embodiments, the semiconductor device 1d may include an isolation structure 120d and an isolation structure 130d. In some embodiments, the structure and/or composition of the isolation structure 130d may be the same as those of the isolation structure 130c. The isolation structure 130d may include a nitridation layer 132d. The structure and/or composition of the nitridation layer 132d may be the same as those of the nitridation layer 132c.

In some embodiments, the isolation structure 120d may include an oxidation layer 123. In some embodiments, the oxidation layer 123 may contact the substrate 100. In some embodiments, the oxidation layer 123 may be spaced apart from the isolation layer 12E hi some embodiments, the oxidation layer 123 may include silicon oxide.

In some embodiments, the isolation structure 120d may include a nitridation layer 122d. In some embodiments, the nitridation layer 122d may be disposed between the isolation layer 121 and the oxidation layer 123. In some embodiments, the oxidation layer 123 may contact the nitridation layer 122d. In some embodiments, the nitridation layer 122d may be spaced apart from the substrate 100. In some embodiments, the nitridation layer 122d may include or be made of $Si_xO_yN_z$, wherein X exceeds 0, Y exceeds 0, and Z exceeds 0.

Figure 5:
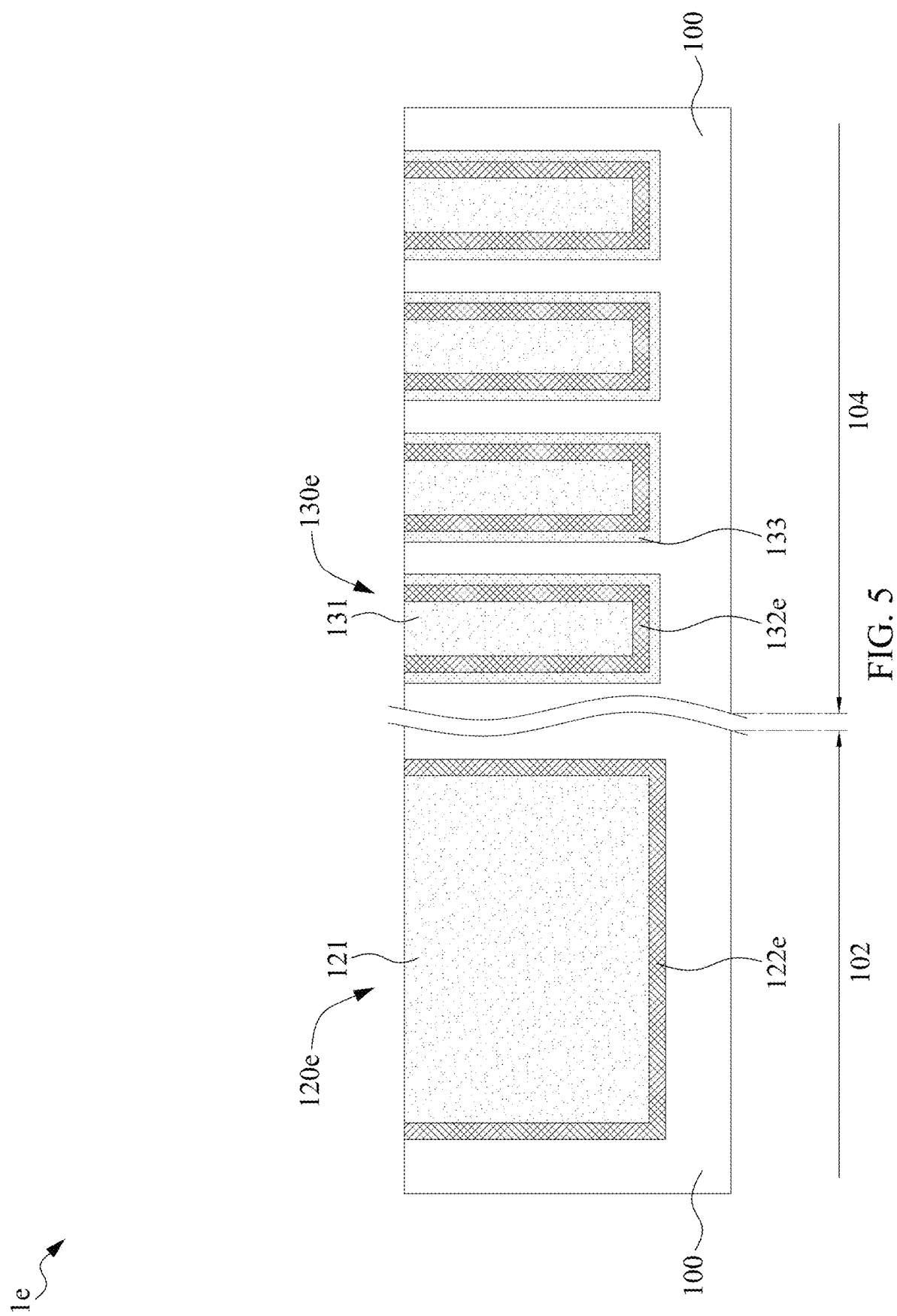
FIG. 5 is a cross-sectional view of a semiconductor device, in accordance with some embodiments of the present disclosure.

FIG. 5 is a cross-section of a semiconductor device 1e, in accordance with some embodiments of the present disclosure. The semiconductor device 1e is similar to the semiconductor device 1d, with differences therebetween as follows.

In some embodiments, the semiconductor device 1e may include an isolation structure 120e and an isolation structure 130e. In some embodiments, the structure and/or composition of the isolation structure 130e may be the same as those of the isolation structure 130c. The isolation structure 130e may include a nitridation layer 132e. The structure and/or composition of the nitridation layer 132e may be the same as those of the nitridation layer 132c.

In some embodiments, the isolation structure 120e may include a nitridation layer 122e. In some embodiments, the structure and/or composition of the nitridation layer 122e may be the same as those of the nitridation layer 122b.

In some embodiments, each of the isolation layers 121 and 131, the nitridation layers 122a-122e and 132a-132e, as well as the oxidation layers 123 and 133 may also be referred to as a dielectric layer.

Figure 6:
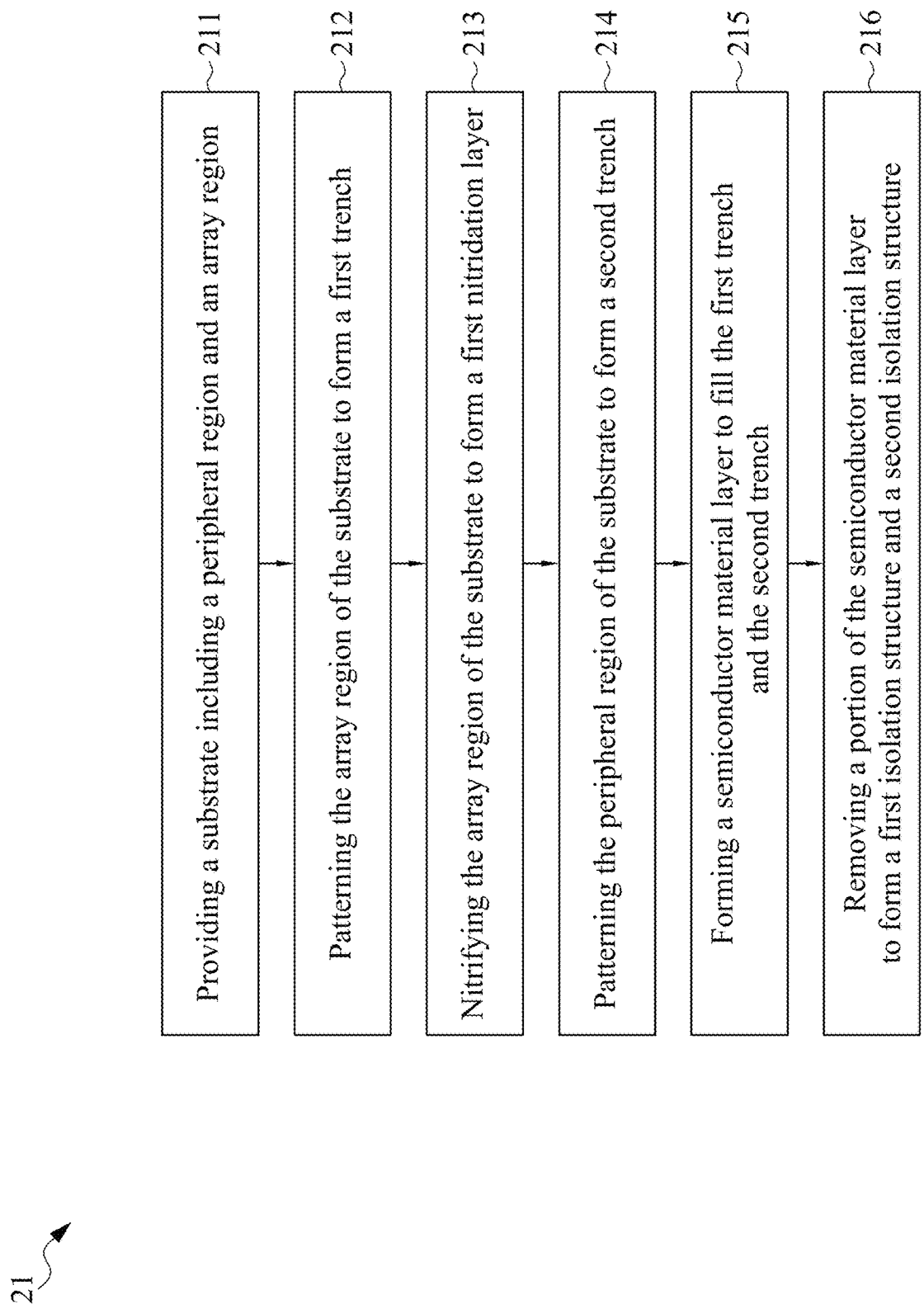
FIG. 6 is a flowchart illustrating a method of manufacturing a semiconductor device, in accordance with some embodiments of the present disclosure.

FIG. 6 is a flowchart of a method 21 of manufacturing a semiconductor device, in accordance with some embodiments of the present disclosure.

The method 21 begins with operation 211 in which a substrate may be provided. The substrate may include a peripheral region and an array region. In some embodiments, a first dielectric layer may be formed on or over the substrate. In some embodiments, a second dielectric layer may be formed on or over the first dielectric layer. The composition of the second dielectric layer may be different from that of the first dielectric layer. In some embodiments, the first dielectric layer may be made of silicon oxide, and the second dielectric layer may be made of silicon nitride.

The method 21 continues with operation 212 in which the array region of the substrate may be patterned, thereby forming a plurality of first trenches. In some embodiments, the peripheral region of the substrate may be covered by a mask. The first trench may penetrate the first dielectric layer. The first trench may penetrate the second dielectric layer.

The method 21 continues with operation 213 in which the array region of the substrate may be nitrified, thereby forming a first nitridation layer. In some embodiments, the first nitridation layer may be formed within the first trench. In some embodiments, a nitrification process may be performed. In some embodiments, the nitrification process may include decoupled plasma nitridation (DPN) process, rapid thermal nitridation (RTN) process, or other suitable techniques. In some embodiments, the reaction gas may react with the array region of the substrate to form a first nitridation layer. In some embodiments, the first nitridation layer may include or be made of $Si_xN_z$, wherein X exceeds 0, and Z exceeds 0.

The method 21 continues with operation 214 in which the peripheral region of the substrate may be patterned, thereby forming a second trench. In some embodiments, the first trench may have dimensions different from those of the second trench. In some embodiments, the first trench may have a width different from that of the second trench. For example, the width of the second trench may exceed that of the first trench. In some embodiments, the first trench may have a depth different from that of the second trench. For example, the depth of the second trench may exceed that of the first trench. In some embodiments, the first trench may have an aspect ratio different from that of the second trench. For example, the aspect ratio of the first trench may be less than the aspect ratio of the second trench.

The method 21 continues with operation 215 in which a dielectric material layer may be formed. In some embodiments, the dielectric material layer may fill the first trench. In some embodiments, the dielectric material layer may fill the second trench. In some embodiments, the dielectric material layer may be formed over the first dielectric layer. In some embodiments, the dielectric material layer may be formed over the second dielectric layer.

The method 21 continues with operation 216 in which a portion of the semiconductor dielectric material layer may be removed. The first dielectric layer may be removed. The second dielectric layer may be removed. A second isolation layer may be formed within the second trench. A first isolation layer may be formed within the first trench, A second isolation structure may be formed within the peripheral region of the substrate. A first isolation structure may be formed within the array region of the substrate. As a result, a semiconductor device may be produced.

The method 21 is merely an example, and is not intended to limit the present disclosure beyond what is explicitly recited in the claims. Additional operations can be provided before, during, or after each operation of the method 21, and some operations described can be replaced, eliminated, or reordered for additional embodiments of the method. In some embodiments, the method 21 can include further operations not depicted in FIG. 6. In some embodiments, the method 21 can include one or more operations depicted in FIG. 6.

FIG. 7A, FIG. 7B, FIG. 7C, FIG. 7D, FIG. 7E, and FIG. 7F all illustrate one or more stages of an exemplary method for manufacturing a semiconductor device according to some embodiments of the present disclosure. In some embodiments, the method is for manufacturing a semiconductor device, such as the semiconductor device 1a shown in FIGS. 1A and 1B.

Figure 7A:
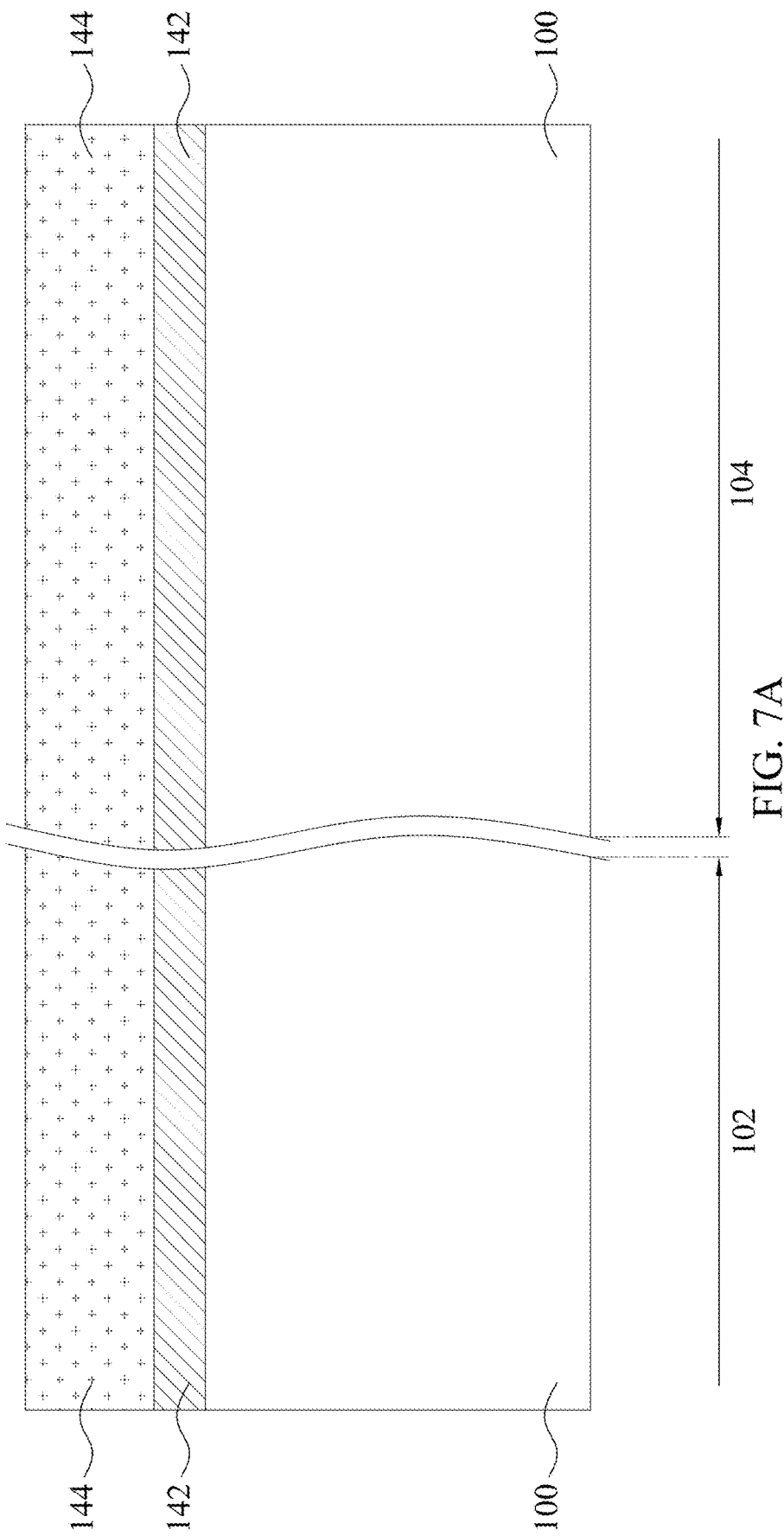
FIG. 7A illustrates one or more stages of an exemplary method for manufacturing a semiconductor device according to some embodiments of the present disclosure.

As shown in FIG. 7A, a substrate 100 may be provided. The substrate 100 may include a peripheral region 102 and an array region 104. In some embodiments, a dielectric layer 142 may be formed on or over the substrate 100. In some embodiments, the dielectric layer 142 may include silicon oxide, silicon nitride, silicon oxynitride, fluoride-doped silicate glass, or other suitable materials. The dielectric layer 142 may be formed by chemical vapor deposition (CVD), atomic layer deposition (ALD), physical vapor deposition (PVD), low-pressure chemical vapor deposition (LPCVD), or other suitable processes.

In some embodiments, a dielectric layer 144 may be formed on or over the dielectric layer 142. The composition of the dielectric layer 144 may be different from that of the dielectric layer 142. In some embodiments, the dielectric layer 144 may include silicon nitride, silicon oxide, silicon oxynitride, fluoride-doped silicate glass, or other suitable materials. The dielectric layer 144 may be formed by CVD, ALD, PVD, LPCVD, or other suitable processes. In some embodiments, the dielectric layer 142 may be made of silicon oxide, and the dielectric layer 144 may be made of silicon nitride.

Figure 7B:
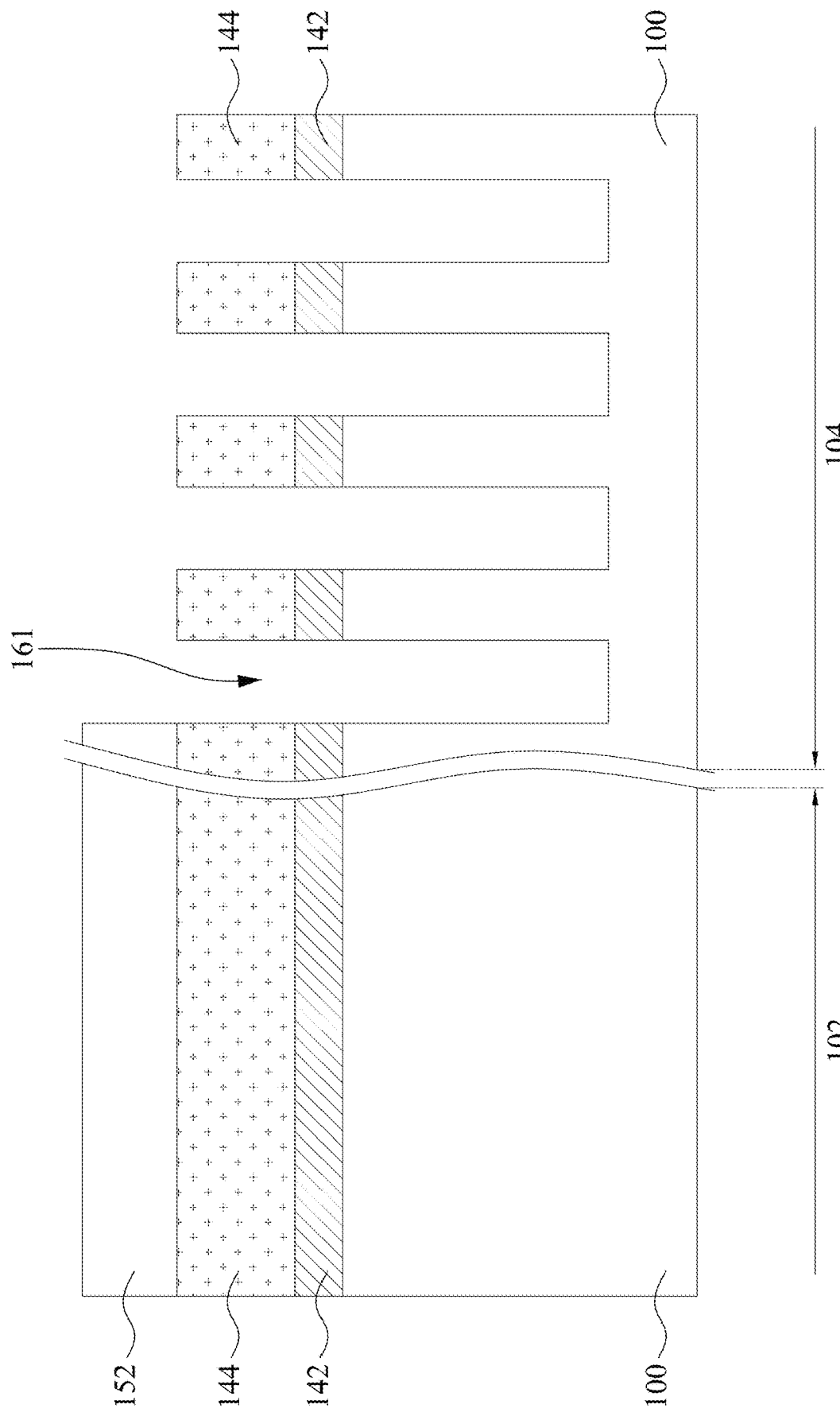
FIG. 7B illustrates one or more stages of an exemplary method for manufacturing a semiconductor device according to some embodiments of the present disclosure.

As shown in FIG. 7B, the array region 104 of the substrate 100 may be patterned, thereby forming a plurality of trenches 161. In some embodiments, the peripheral region 102 of the substrate 100 may be covered by a mask 152. The mask 152 may include, for example, a photoresist layer or other suitable materials. The trench 161 may penetrate the dielectric layer 142. The trench 161 may penetrate the dielectric layer 144. The trench 161 may be formed by a patterning process. The patterning process may include a lithography process, an etching process and other suitable processes. The photolithography process may include photoresist coating (e.g., spin-on coating), soft baking, mask alignment, exposure, post-exposure baking, developing the photoresist, rinsing, and drying (e.g., hard baking). The etching process may include, for example, dry or wet etching.

Figure 7C:
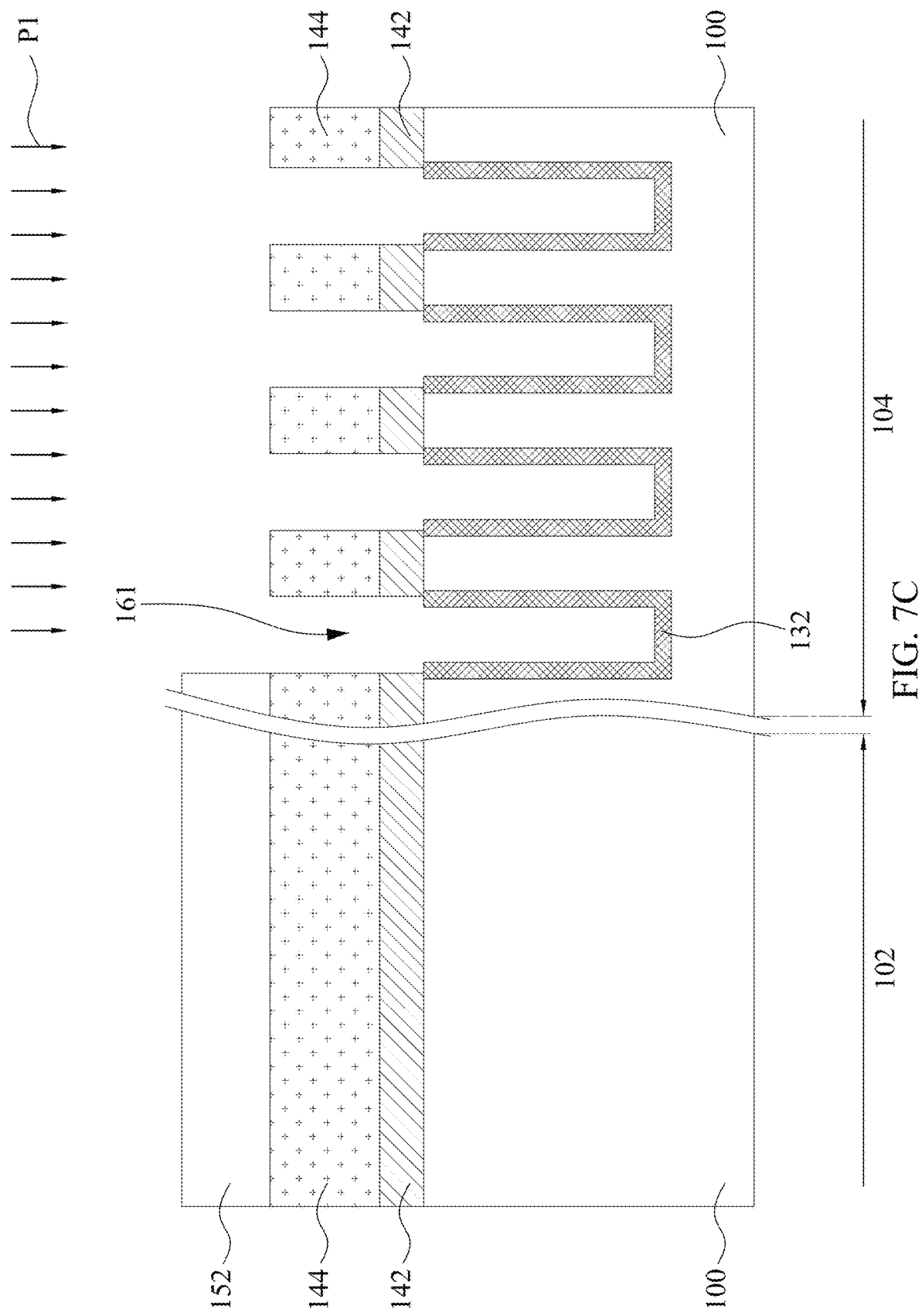
FIG. 7C illustrates one or more stages of an exemplary method for manufacturing a semiconductor device according to some embodiments of the present disclosure.

As shown in FIG. 7C, the array region 104 of the substrate 100 may be nitrified, thereby forming a nitridation layer 132. In some embodiments, the nitridation layer 132 may be formed within the trench 161. In some embodiments, a lateral surface (not annotated in the figure) of the nitridation layer 132 may be non-coplanar with a lateral surface (not annotated in the figure) of the dielectric layer 142. In some embodiments, the lateral surface of the nitridation layer 132 may be non-coplanar with a lateral surface (not annotated in the figure) of the dielectric layer 144. In some embodiments, a nitrification process P1 may be performed. In some embodiments, the nitrification process P1 may include decoupled plasma nitridation (DPN) process, rapid thermal nitridation (RTN) process, or other suitable techniques.

In some embodiments, a reaction gas may be utilized during the nitrification process P1. In some embodiments, the reaction gas may include a nitrogen-containing gas, such as $N_2$, $N_2O$, $NO_2$, $NH_3$ and the like. Suitable examples of the inert gas supplied with the reaction gas mixture include at least one of Ar, He, Kr, and the like. The process temperature may range from about 200° C. to about 600° C., in accordance with some embodiments.

In some embodiments, the reaction gas may react with the array region 104 of the substrate 100 to form a nitridation layer 132. In some embodiments, the nitridation layer 132 may include or be made of $Si_xN_z$, wherein X exceeds 0, and Z exceeds 0. In some embodiments, the ratio between X and Z may depend on, for example, the process time and the concentration of the reaction gas. In some embodiments, X may exceed Z. In some embodiments, Z may exceed X.

Figure 7D:
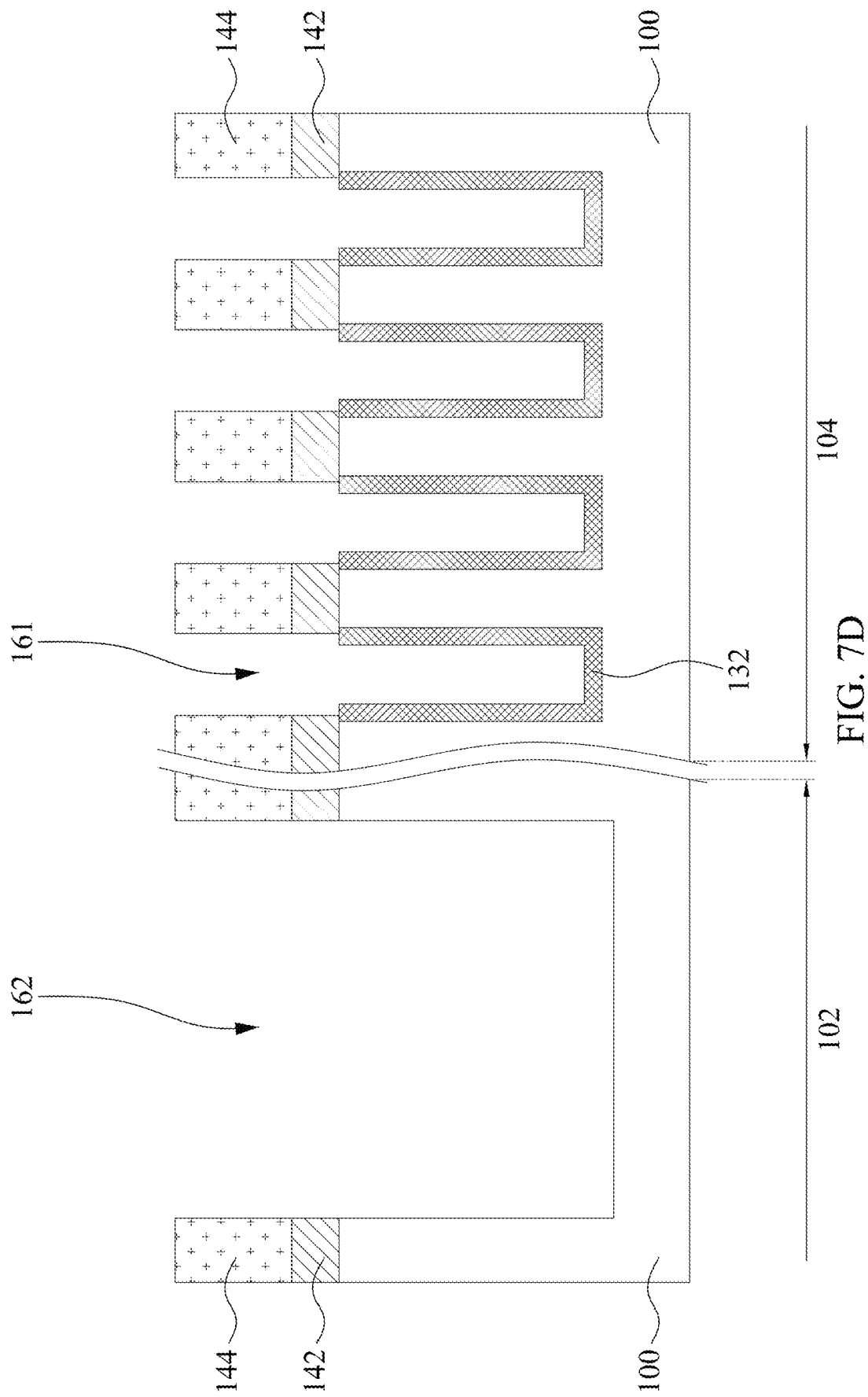
FIG. 7D illustrates one or more stages of an exemplary method for manufacturing a semiconductor device according to some embodiments of the present disclosure.

As shown in FIG. 7D, the peripheral region 102 of the substrate 100 may be patterned, thereby forming a trench 162. In some embodiments, the trench 161 may have dimensions different from those of the trench 162. In some embodiments, the trench 161 may have a width different from that of the trench 162. For example, the width of the trench 162 may exceed that of the trench 161. In some embodiments, the trench 161 may have a depth different from that of the trench 162. For example, the depth of the trench 162 may exceed that of the trench 161. In some embodiments, the trench 161 may have an aspect ratio different from that of the trench 162, For example, the aspect ratio of the trench 161 may be less than the aspect ratio of the trench 162.

Figure 7E:
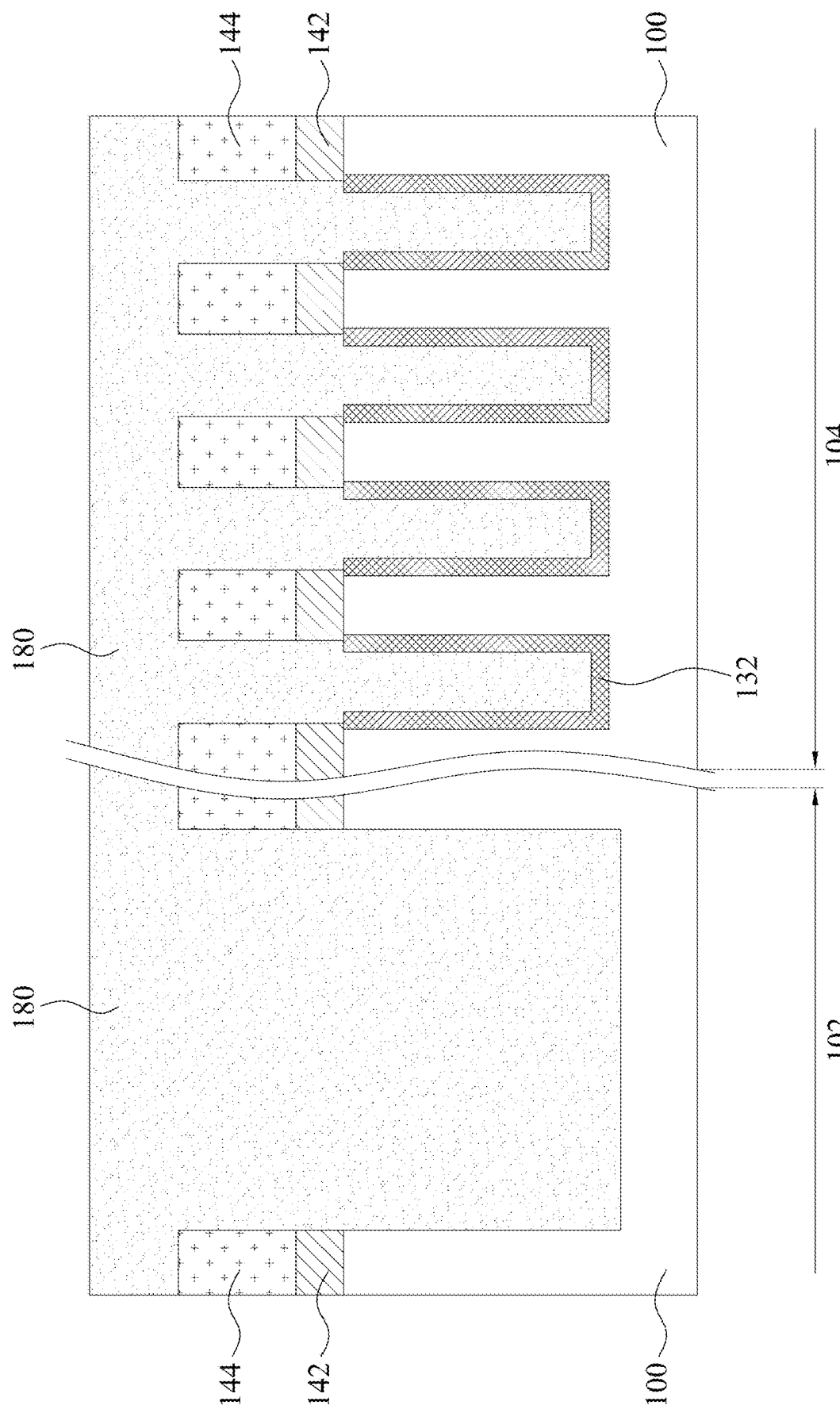
FIG. 7E illustrates one or more stages of an exemplary method for manufacturing a semiconductor device according to some embodiments of the present disclosure.

As shown in FIG. 7E, a dielectric material 180 may be formed. In some embodiments, the dielectric material 180 may fill the trench 161. In some embodiments, the dielectric material 180 may fill the trench 162. In some embodiments, the dielectric material 180 may be formed over the dielectric layer 142. In some embodiments, the dielectric material 180 may be formed over the dielectric layer 144. In some embodiments, the dielectric material 180 may include a dielectric material, such as silicon oxide, silicon nitride, silicon oxynitride, fluoride-doped silicate glass (FSG), a low-K dielectric material, another suitable material, or a combination thereof, in accordance with some embodiments. The dielectric material 180 may be formed by CVD, ALD, PVD, LPCVD, or other suitable process.

As shown in FIG. 7E a portion of the dielectric material 180 may be removed. The dielectric layer 142 may be removed. The dielectric layer 144 may be removed, An isolation layer 121 may be formed within the trench 162. An isolation layer 131 may be formed within the trench 161. An isolation structure 120 may be formed within the peripheral region 102 of the substrate 100. An isolation structure 130 may be formed within the array region 104 of the substrate 100. As a result, a semiconductor device, such as semiconductor device 1a as shown in FIG. 1B, may be formed.

In a comparative example, the substrate is not nitrified, and the isolation layer is deposited within the trench of the substrate. In comparison with the comparative example, the retention time can be enhanced by up to 36% or more.

Figure 8:
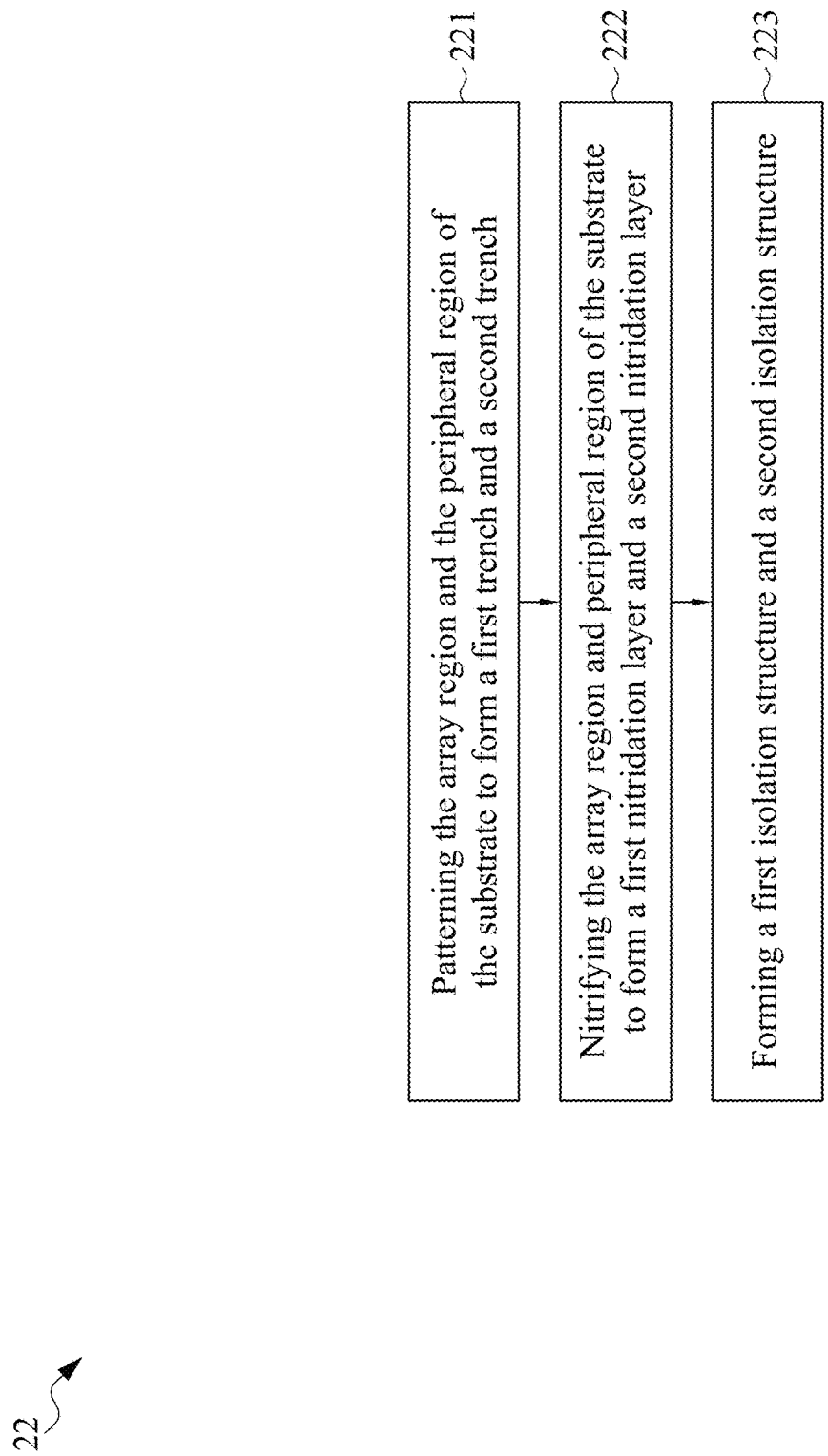
FIG. 8 is a flowchart illustrating a method of manufacturing a semiconductor device, in accordance with some embodiments of the present disclosure.

FIG. 8 is a flowchart of a method 22 of manufacturing a semiconductor device, in accordance with some embodiments of the present disclosure.

The method 22 begins with operation 221. The operation 221 may be subsequent to the operation 211. The peripheral region and array region of the substrate may be patterned, thereby forming the first trench and second trench. The first trench and second trench may penetrate the first dielectric layer. The first trench and second trench may penetrate the second dielectric layer. The first trench and the second trench may be formed by a patterning process.

The method 22 continues with operation 222 in which the peripheral region and array region of the substrate may be nitrified, thereby forming a second nitridation layer and first nitridation layer. In some embodiments, the first nitridation layer may be formed within the first trench. In some embodiments, the second nitridation layer may be formed within the second trench. In some embodiments, a nitrification process may be performed. In some embodiments, the second nitridation layer may include or be made of $Si_xN_z$, wherein X exceeds 0, and Z exceeds 0.

The method 22 continues with operation 223 in which the first isolation layer may be formed within the first trench, and the second isolation layer may be formed within the second trench. The first isolation structure may be formed within the array region of the substrate. The second isolation structure may be formed within the peripheral region of the substrate. As a result, a semiconductor device may be produced.

The method 22 is merely an example, and is not intended to limit the present disclosure beyond what is explicitly recited in the claims. Additional operations can be provided before, during, or after each operation of the method 22, and some operations described can be replaced, eliminated, or reordered for additional embodiments of the method. In some embodiments, the method 22 can include further operations not depicted in FIG. 8. In some embodiments, the method 22 can include one or more operations depicted in FIG. 8.

Figure 9A:
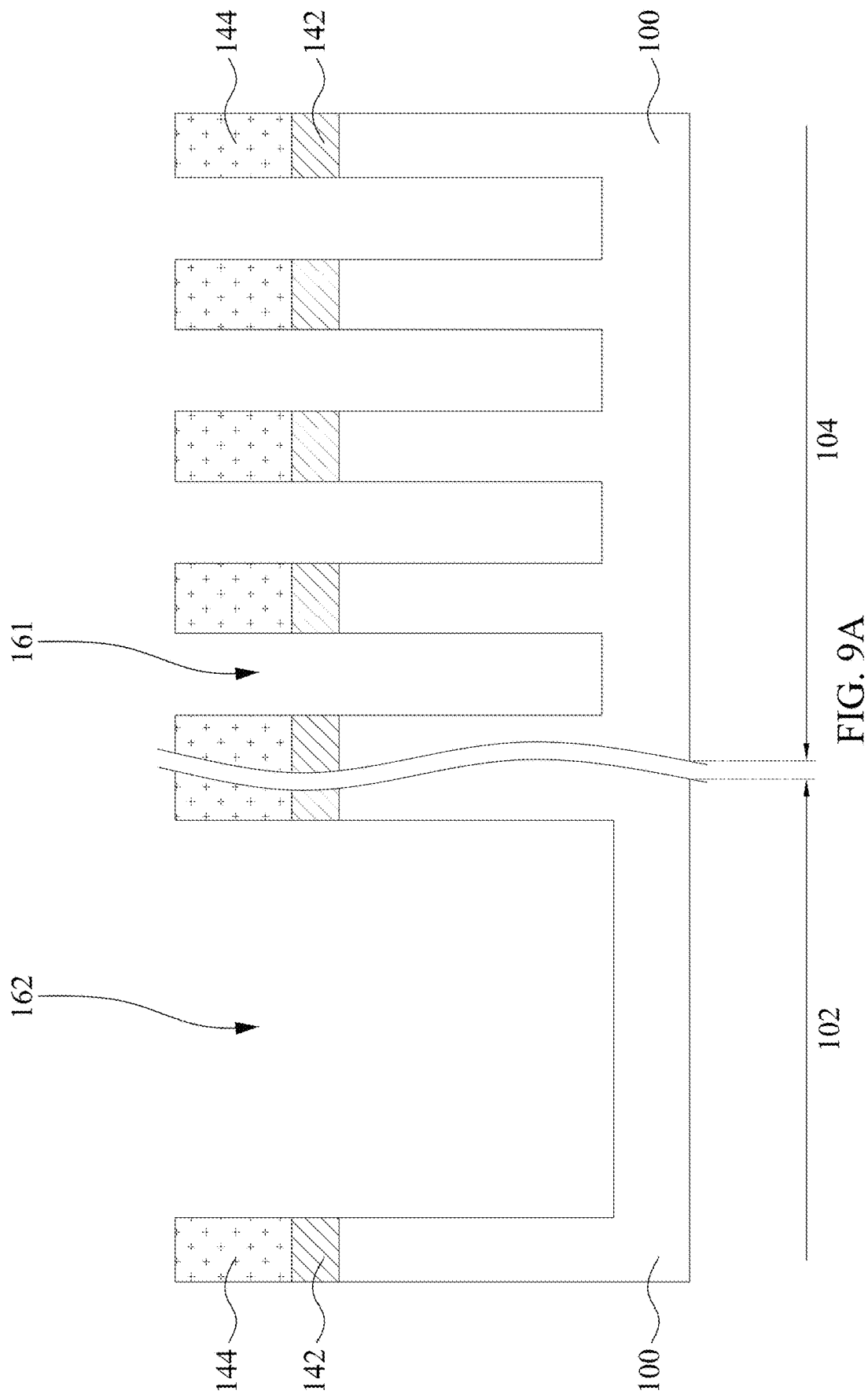
FIG. 9A illustrates one or more stages of an exemplary method for manufacturing a semiconductor device according to some embodiments of the present disclosure.
Figure 9B:
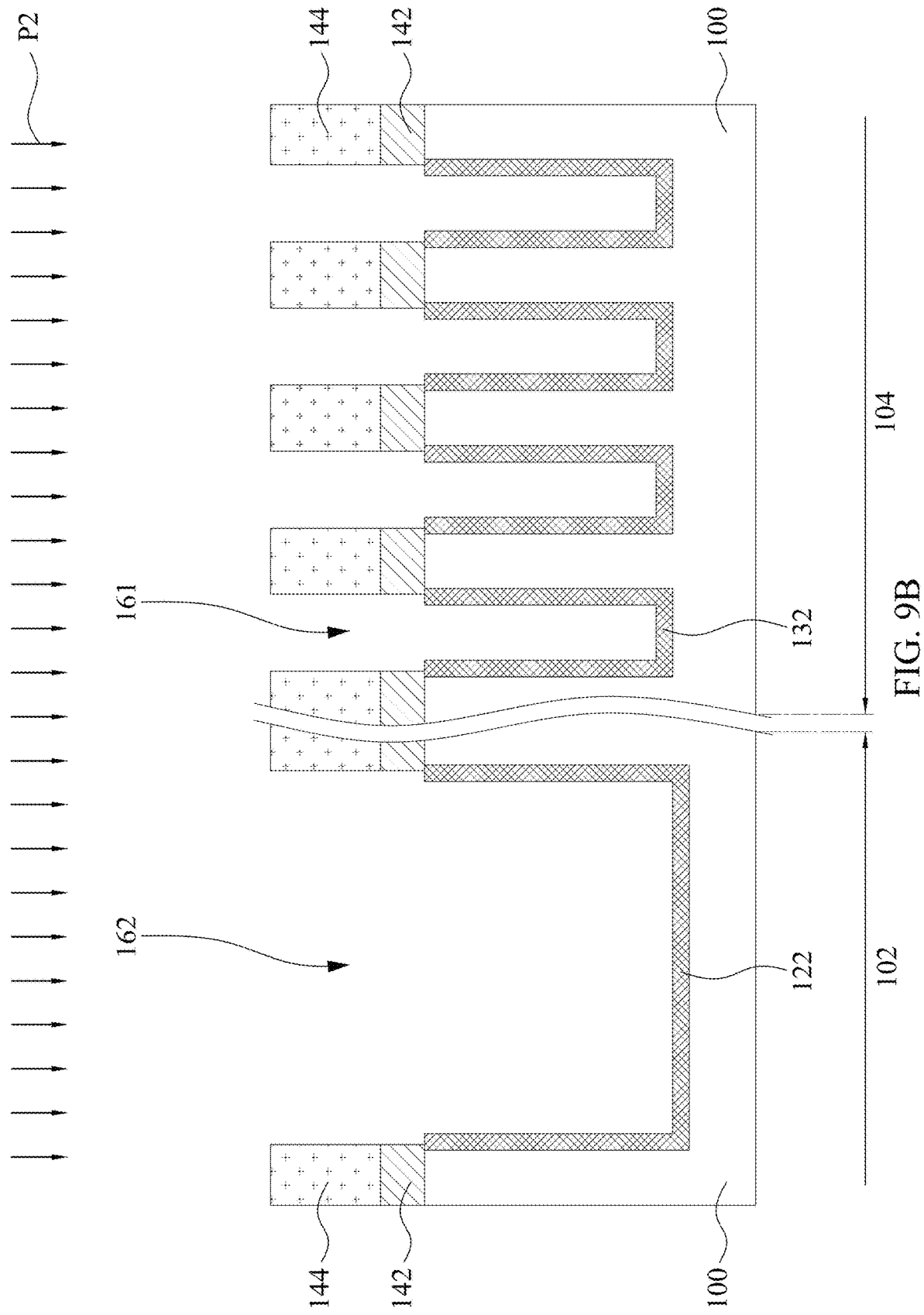
FIG. 9B illustrates one or more stages of an exemplary method for manufacturing a semiconductor device according to some embodiments of the present disclosure.
Figure 9C:
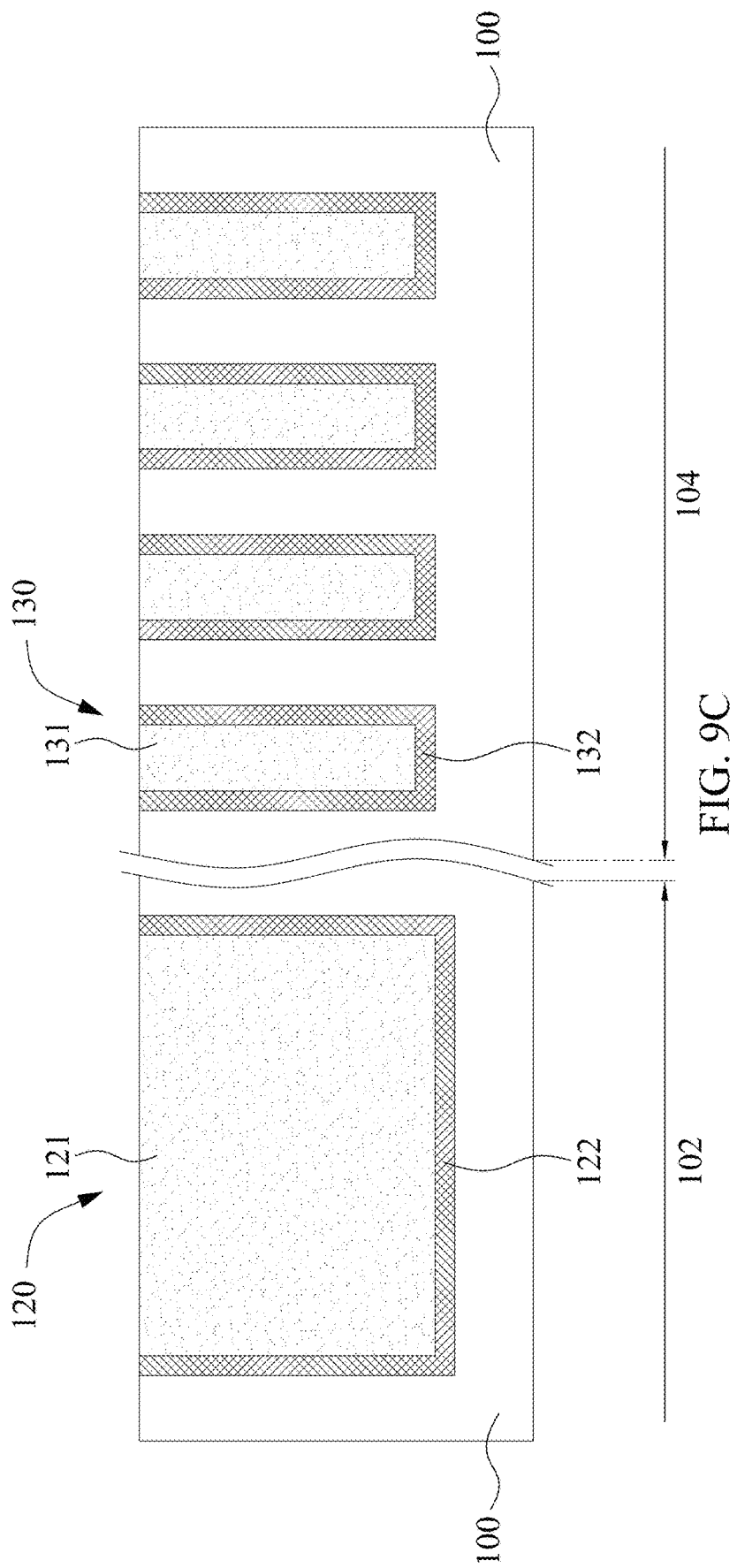
FIG. 9C illustrates one or more stages of an exemplary method for manufacturing a semiconductor device according to some embodiments of the present disclosure.

FIG. 9A, FIG. 9B and FIG. 9C illustrate one or more stages of an exemplary method for manufacturing a semiconductor device according to some embodiments of the present disclosure. In some embodiments, the method is for manufacturing a semiconductor device, such as the semiconductor device 1b shown in FIG. 2. The initial stage of the illustrated process is the same as, or similar to, the stage illustrated in FIG. 7A. FIG. 9A depict a stage subsequent to that depicted in FIG. 7A.

Referring to FIG. 9A, the peripheral region 102 and array region 104 of the substrate 100 may be patterned, thereby forming the trench 161 and trench 162. Each of the trenches 161 and 162 may penetrate the dielectric layer 142. Each of the trenches 161 and 162 may penetrate the dielectric layer 144. Each of the trenches 161 and 162 may be formed by a patterning process.

Referring to FIG. 9B, the peripheral region 102 and array region 104 of the substrate 100 may be nitrified, thereby forming the nitridation layer 122 and nitridation layer 132. In some embodiments, the nitridation layer 122 may be formed within the trench 162. In some embodiments, the nitridation layer 132 may be formed within the trench 161. In some embodiments, a lateral surface (not annotated in the figure) of the nitridation layer 122 may be non-coplanar with the lateral surface of the dielectric layer 142. In some embodiments, the lateral surface of the nitridation layer 122 may be non-coplanar with the lateral surface of the dielectric layer 144. In some embodiments, a nitrification process P2 may be performed. In some embodiments, the nitrification process P2 may include DPN, RTN, or other suitable techniques. In some embodiments, the nitridation layer 122 may include or be made of $Si_xN_z$, wherein X exceeds 0, and Z exceeds 0.

Referring to FIG. 9C, the isolation layer 121 may be formed within the trench 162, and the isolation layer 131 may be formed within the trench 161. The isolation structure 120 may be formed within the peripheral region 102 of the substrate 100. The isolation structure 130 may be formed within the array region 104 of the substrate 100. As a result, a semiconductor device, such as semiconductor device 1b as shown in FIG. 2, may be formed.

Figure 10:
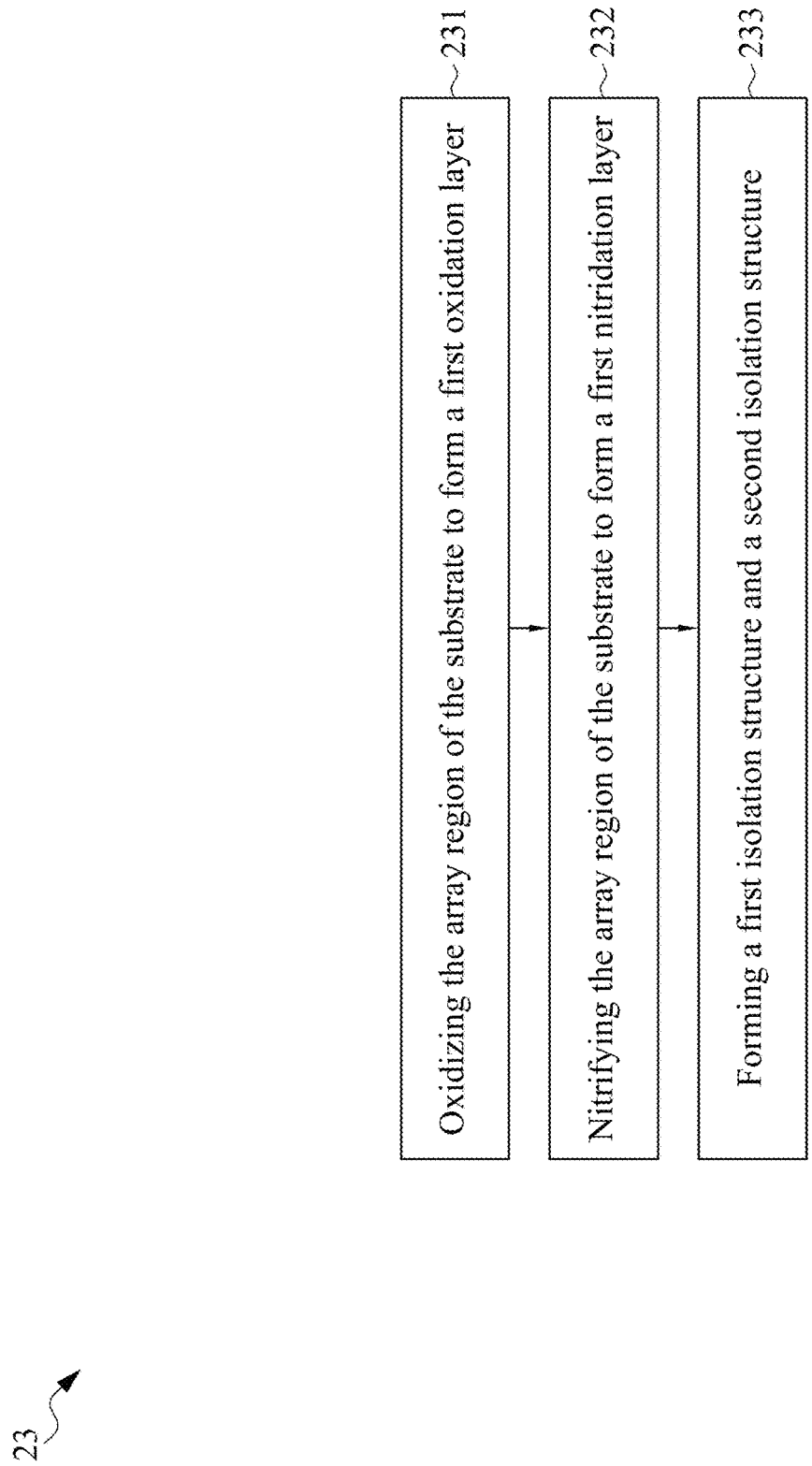
FIG. 10 is a flowchart illustrating a method of manufacturing a semiconductor device, in accordance with some embodiments of the present disclosure.

FIG. 10 is a flowchart of a method 23 of manufacturing a semiconductor device, in accordance with some embodiments of the present disclosure.

The method 23 begins with operation 231. The operation 231 may be subsequent to operation 212. The array region of the substrate may be oxidized, thereby forming a first oxidation layer within the first trench. In some embodiments, an oxidation process may be performed. In some embodiments, the oxidation process may include thermal oxidation or other suitable techniques.

The method 23 continues with operation 232 in which the array region of the substrate may be nitrified, thereby forming the first nitridation layer. In some embodiments, the first nitridation layer may be formed on the first oxidation layer. In some embodiments, a nitrification process may be performed. In some embodiments, the reaction gas utilized in process may react with the first oxidation layer to form the first nitridation layer. In some embodiments, the first nitridation layer may include or be made of $Si_xO_yN_z$, wherein X exceeds 0, Y exceeds 0, and Z exceeds 0.

The method 23 continues with operation 233 in which the first isolation layer may be formed within the first trench, and the second isolation layer may be formed within the second trench. The first isolation structure may be formed within the array region of the substrate. The second isolation structure may be formed within the peripheral region of the substrate. As a result, a semiconductor device may be produced.

The method 23 is merely an example, and is not intended to limit the present disclosure beyond what is explicitly recited in the claims. Additional operations can be provided before, during, or after each operation of the method 23, and some operations described can be replaced, eliminated, or reordered for additional embodiments of the method. In some embodiments, the method 23 can include further operations not depicted in FIG. 10. In some embodiments, the method 23 can include one or more operations depicted in FIG. 10.

Figure 11A:
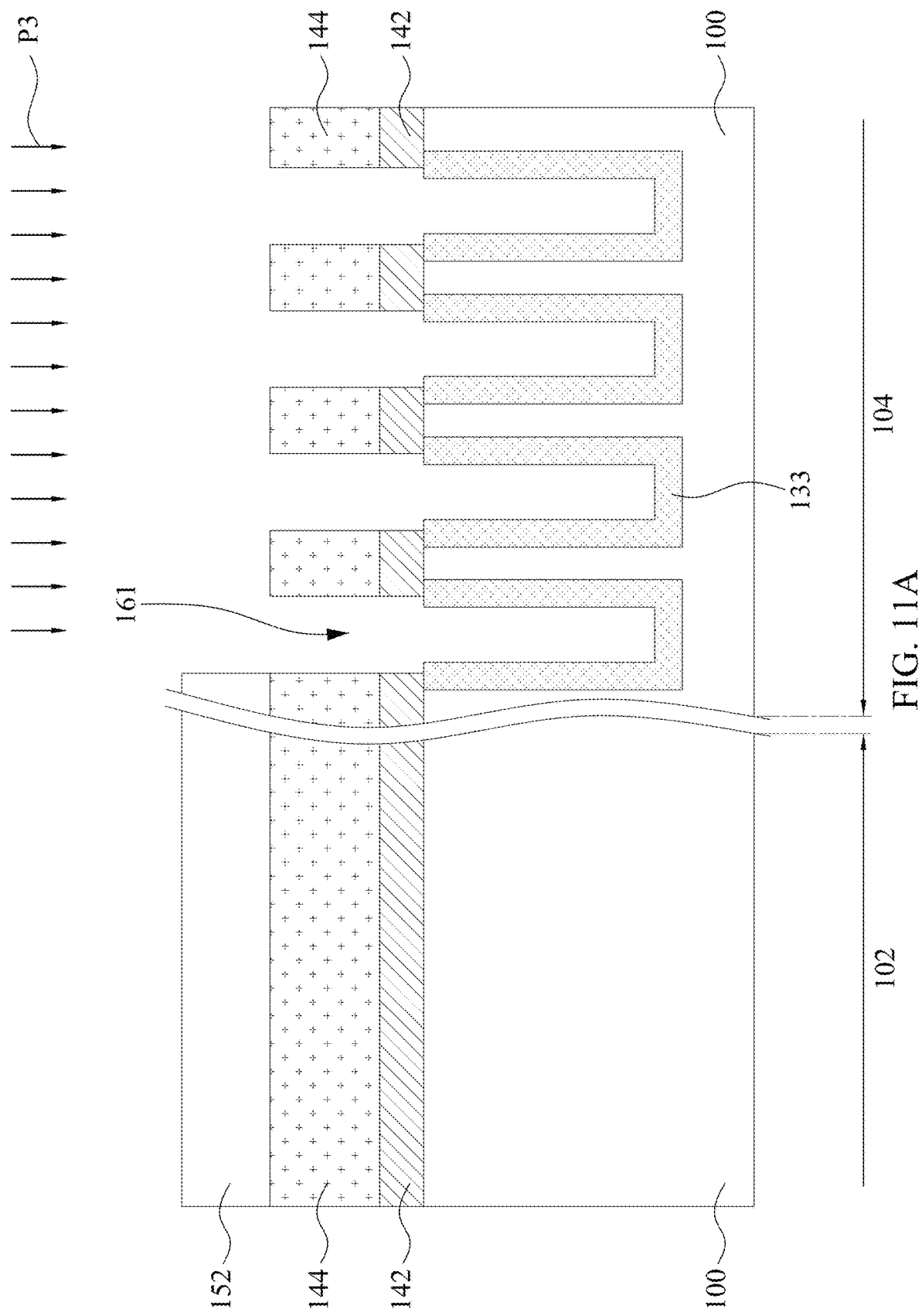
FIG. 11A illustrates one or more stages of an exemplary method for manufacturing a semiconductor device according to some embodiments of the present disclosure.
Figure 11C:
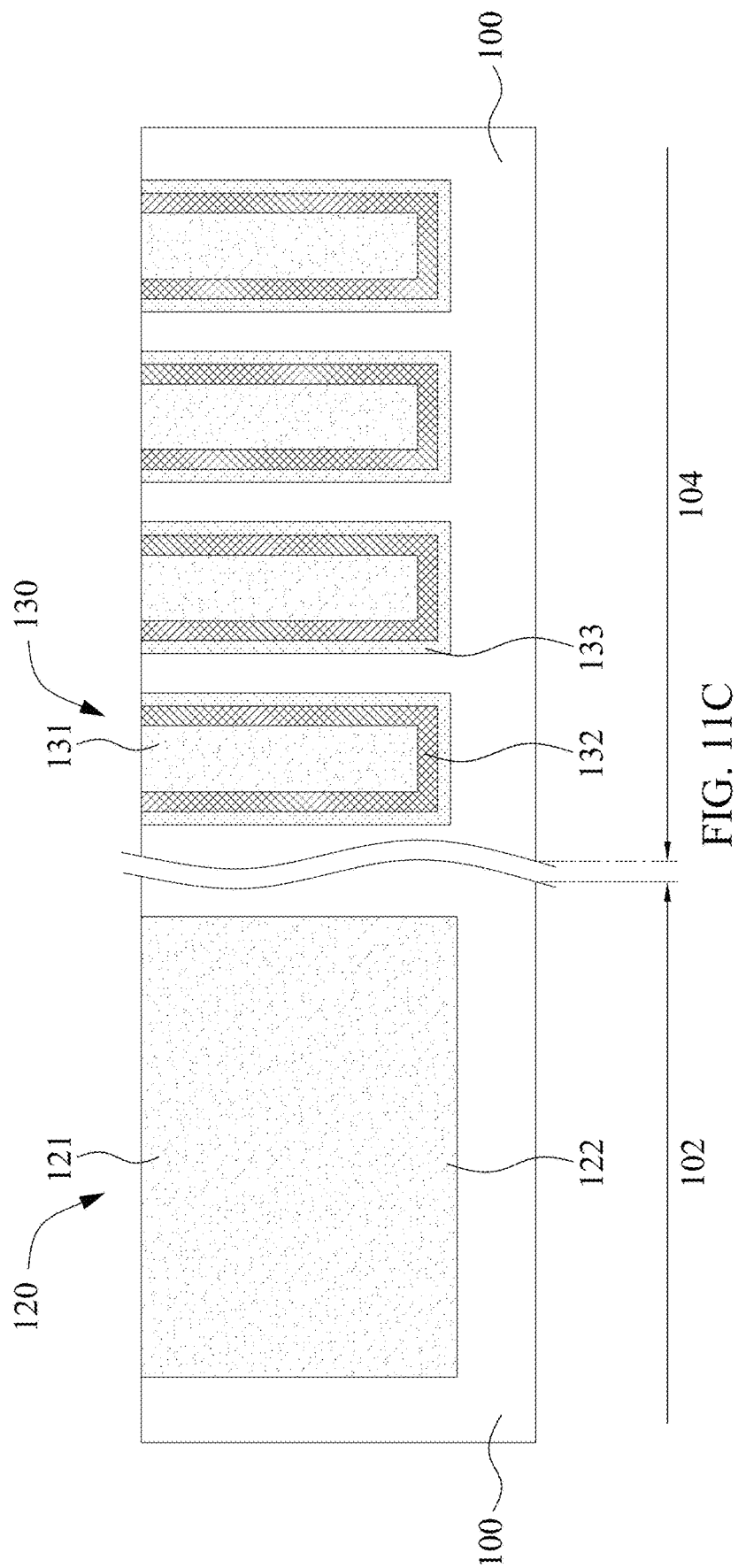
FIG. 11C illustrates one or more stages of an exemplary method for manufacturing a semiconductor device according to some embodiments of the present disclosure.

FIG. 11A, FIG. 11B and FIG. 11C illustrate one or more stages of an exemplary method for manufacturing a semiconductor device according to some embodiments of the present disclosure. In some embodiments, the method is for manufacturing a semiconductor device, such as the semiconductor device 1c shown in FIG. 3. The initial stage of the illustrated process is the same as, or similar to, the stage illustrated in FIG. 7B. FIG. 11A depicts a stage subsequent to that depicted in FIG. 7B.

Referring to FIG. 11A, the array region 104 of the substrate 100 may be oxidized, thereby forming an oxidation layer 133 within the trench 161. In some embodiments, a lateral surface (not annotated in the figure) of the oxidation layer 133 may be non-coplanar with the lateral surface of the dielectric layer 142. In some embodiments, the lateral surface of the oxidation layer 133 may be non-coplanar with the lateral surface of the dielectric layer 144. In some embodiments, an oxidation process P3 may be performed. In some embodiments, the oxidation process P3 may include thermal oxidation process or other suitable techniques.

Referring to FIG. 11B, the array region 104 of the substrate 100 may be nitrified, thereby forming the nitridation layer 132. In some embodiments, the nitridation layer 132 may be formed on the oxidation layer 133. In some embodiments, a nitrification process P4 may be performed. In some embodiments, the nitrification process P4 may include DPN, RTN, or other suitable techniques. In some embodiments, the reaction gas utilized in process P4 may react with the oxidation layer 133 to form the nitridation layer 132. In some embodiments, the nitridation layer 132 may include or be made of $Si_xO_yN_z$, wherein X exceeds 0, Y exceeds 0, and Z exceeds 0. In some embodiments, the ratio among X, Y and Z may depend on, for example, the process time and the concentration of the reaction gas. In some embodiments, Y may exceed Z. In some embodiments, Z may exceed Y.

Referring to FIG. 11C, the isolation layer 121 may be formed within the trench 162, and the isolation layer 131 may be formed within the trench 161. The isolation structure 120 may be formed within the peripheral region 102 of the substrate 100. The isolation structure 130 may be formed within the array region 104 of the substrate 100. As a result, a semiconductor device, such as semiconductor device 1c as shown in FIG. 3, may be formed.

Figure 12:
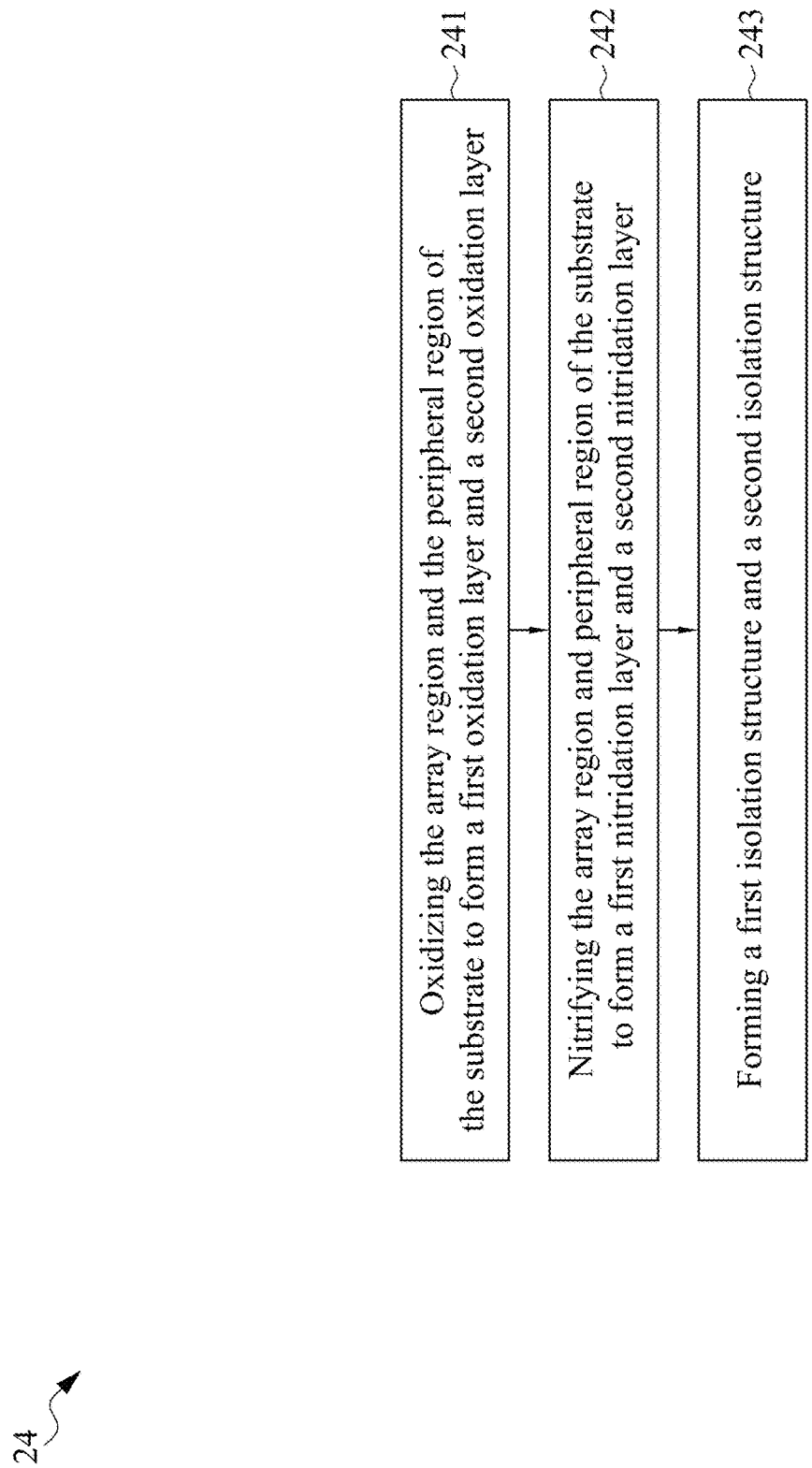
FIG. 12 is a flowchart illustrating a method of manufacturing a semiconductor device, in accordance with some embodiments of the present disclosure.

FIG. 12 is a flowchart of a method 24 of manufacturing a semiconductor device, in accordance with some embodiments of the present disclosure.

The method 24 begins with operation 241. Operation 241 may be subsequent to operation 221. The peripheral region and array region of the substrate may be oxidized, thereby forming a first oxidation layer within the first trench and a second oxidation layer within the second trench. In some embodiments, an oxidation process may be performed.

The method 24 continues with operation 242 in which the peripheral region and array region of the substrate may be nitrified, thereby forming second nitridation layer and first nitridation layer. In some embodiments, the second nitridation layer may be formed on the second oxidation layer. In some embodiments, the first nitridation layer may be formed on the first oxidation layer. In some embodiments, a nitrification process may be performed. In some embodiments, the reaction gas utilized in process may react with the second oxidation layer to form the second nitridation layer. In some embodiments, the second nitridation layer may include or be made of $Si_xO_yN_z$, wherein X exceeds 0, Y exceeds 0, and Z exceeds 0.

The method 24 continues with operation 243 in which the first isolation layer may be formed within the first trench, and the second isolation layer may be formed within the second trench. The first isolation structure may be formed within the array region of the substrate. The second isolation structure may be formed within the peripheral region of the substrate. As a result, a semiconductor device may be produced.

The method 24 is merely an example, and is not intended to limit the present disclosure beyond what is explicitly recited in the claims. Additional operations can be provided before, during, or after each operation of the method 24, and some operations described can be replaced, eliminated, or reordered for additional embodiments of the method. In some embodiments, the method 24 can include further operations not depicted in FIG. 12. In some embodiments, the method 24 can include one or more operations depicted in FIG. 12.

Figure 13A:
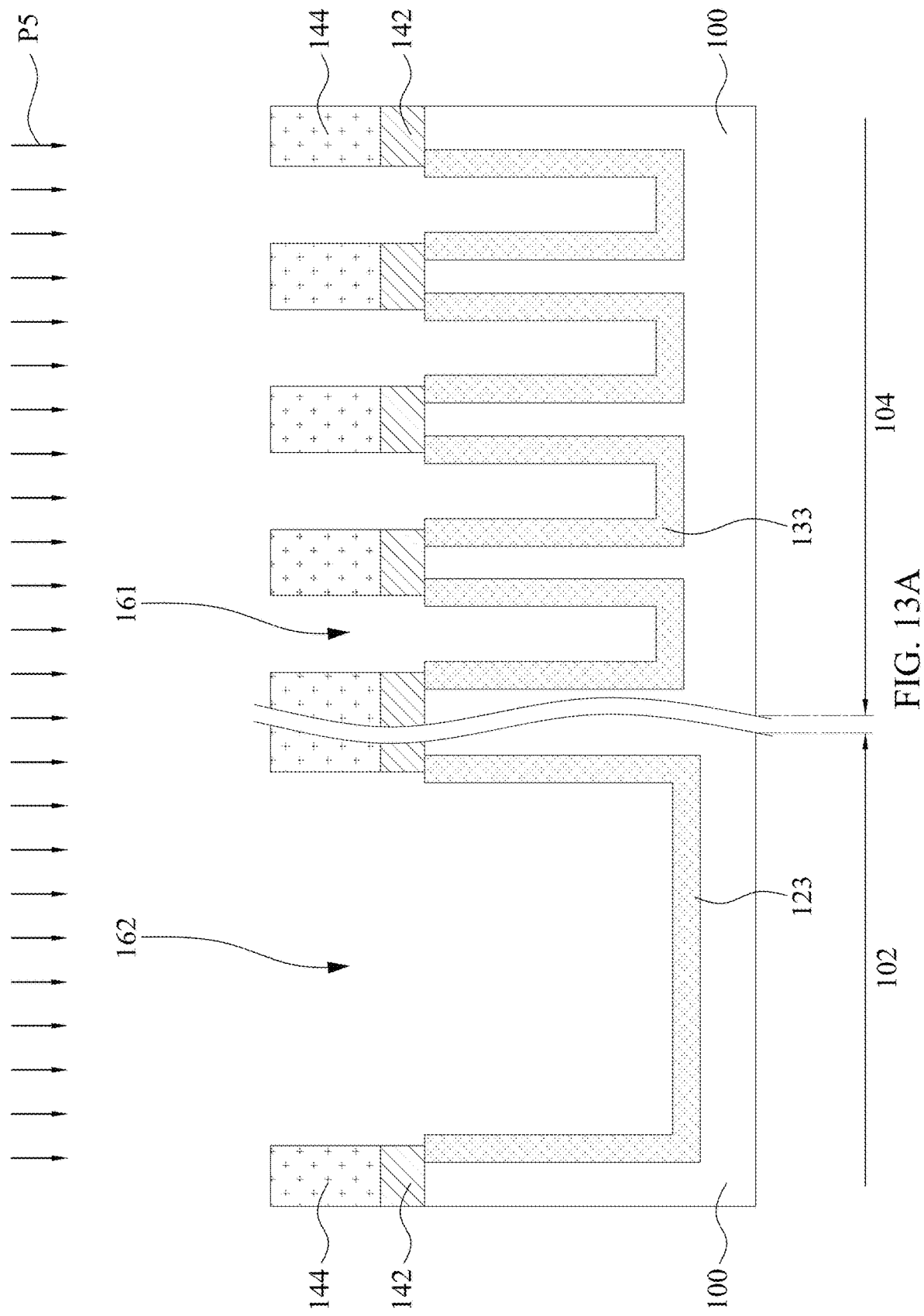
FIG. 13A illustrates one or more stages of an exemplary method for manufacturing a semiconductor device according to some embodiments of the present disclosure.
Figure 13B:
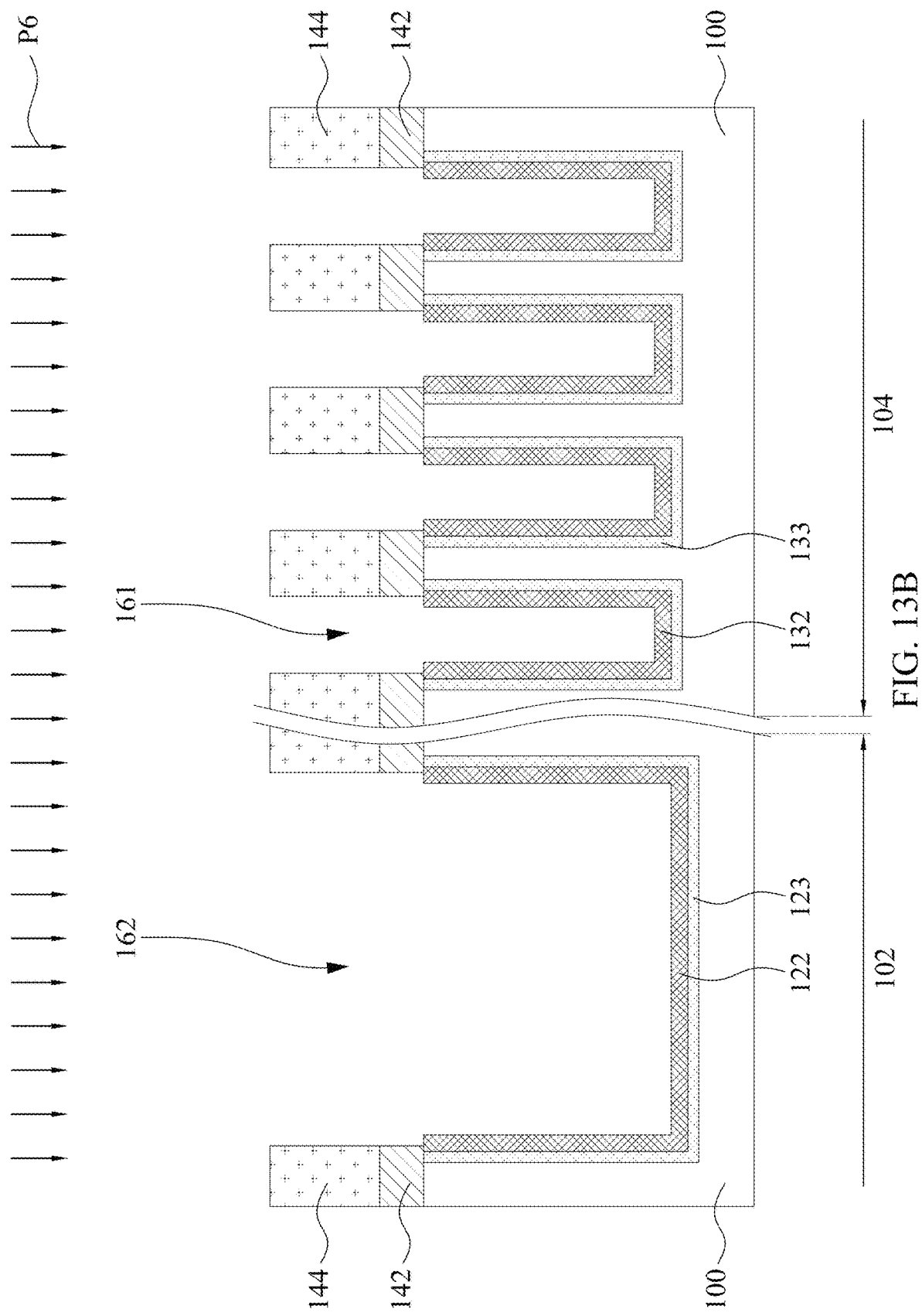
FIG. 13B illustrates one or more stages of an exemplary method for manufacturing a semiconductor device according to some embodiments of the present disclosure.
Figure 13C:
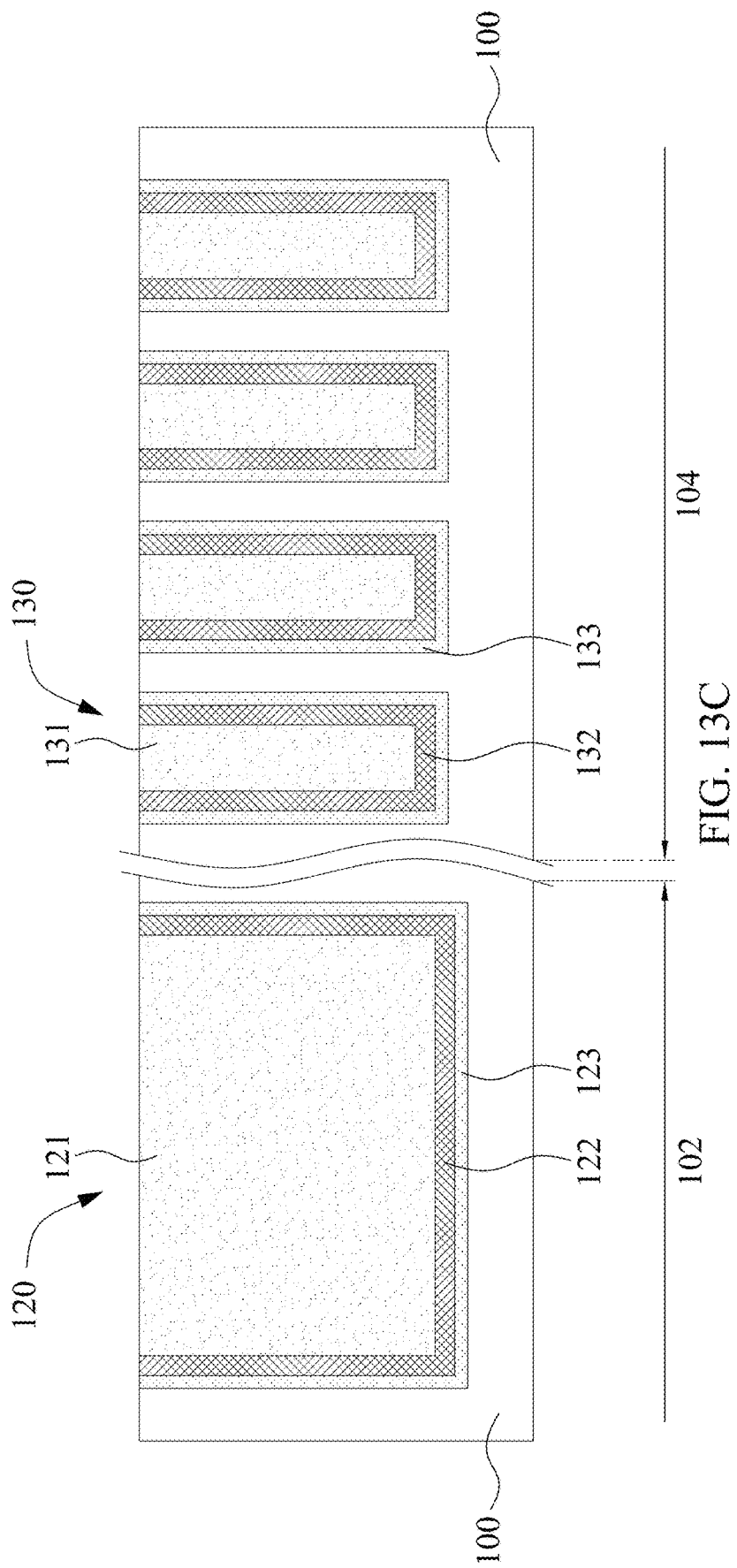
FIG. 13C illustrates one or more stages of an exemplary method for manufacturing a semiconductor device according to some embodiments of the present disclosure.

FIG. 13A, FIG. 13B and FIG. 13C illustrate one or more stages of an exemplary method for manufacturing a semiconductor device according to some embodiments of the present disclosure. In some embodiments, the method is for manufacturing a semiconductor device, such as the semiconductor device 1d shown in FIG. 4. The initial stage of the illustrated process is the same as, or similar to, the stage illustrated in FIG. 9A. FIG. 13A depicts a stage subsequent to that depicted in FIG. 9A.

Referring to FIG. 13A, the peripheral region 102 and array region 104 of the substrate 100 may be oxidized, thereby forming an oxidation layer 133 within the trench 161 and an oxidation layer 123 within the trench 162. In some embodiments, a lateral surface (not annotated in the figure) of the oxidation layer 123 may be non-coplanar with the lateral surface of the dielectric layer 142. In some embodiments, the lateral surface of the oxidation layer 123 may be non-coplanar with the lateral surface of the dielectric layer 144. In some embodiments, an oxidation process P5 may be performed. In some embodiments, the oxidation process P5 may include thermal oxidation process or other suitable techniques.

Referring to FIG. 13B, the peripheral region 102 and array region 104 of the substrate 100 may be nitrified, thereby forming the nitridation layer 122 and nitridation layer 132. In some embodiments, the nitridation layer 122 may be formed on the oxidation layer 123. In some embodiments, the nitridation layer 132 may be formed on the oxidation layer 133. In some embodiments, a nitrification process P6 may be performed. In some embodiments, the nitrification process P6 may include DPN, RTN, or other suitable techniques. In some embodiments, the reaction gas utilized in process P6 may react with the oxidation layer 123 to form the nitridation layer 122. In some embodiments, the nitridation layer 122 may include or be made of $Si_xO_yN_z$, wherein X exceeds 0, Y exceeds 0, and Z exceeds 0.

Referring to FIG. 13C, the isolation layer 121 may be formed within the trench 162, and the isolation layer 131 may be formed within the trench 161. The isolation structure 120 may be formed within the peripheral region 102 of the substrate 100. The isolation structure 130 may be formed within the array region 104 of the substrate 100. As a result, a semiconductor device, such as semiconductor device 1d as shown in FIG. 4, may be formed.

One aspect of the present disclosure provides a semiconductor device. The semiconductor device includes a substrate, a first isolation structure, and a second isolation structure. The substrate has a first region and a second region. The first isolation structure is disposed within the first region of the substrate. The first isolation structure includes a first dielectric layer and a first nitridation layer disposed between the substrate and the first dielectric layer. The second isolation structure is disposed within the second region of the substrate.

Another aspect of the present disclosure provides a semiconductor device. The semiconductor device includes a substrate, a first isolation structure, and a second isolation structure. The substrate has a first region and a second region. The first isolation structure is disposed within the first region of the substrate. The second isolation structure is disposed within the second region of the substrate. A first composition of the first isolation structure is different from a second composition of the second isolation structure.

Another aspect of the present disclosure provides a method of manufacturing a semiconductor device. The method includes providing a substrate. The method also includes forming a first trench within the substrate. The method further includes forming a first nitridation layer within the first trench. In addition, the method includes forming a first isolation layer on the first nitridation layer to form a first isolation structure.

The embodiments of the present disclosure provide a semiconductor device. The substrate may be nitrified before an isolation layer is formed within a trench. The nitrified substrate may assist in improving the retention time of the semiconductor device, especially the semiconductor device including a memory.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, comprising:
   providing a substrate having a first region and a second region;
   forming a first isolation structure within the first region of the substrate; and
   forming a second isolation structure within the second region of the substrate,
   wherein a first composition of the first isolation structure is different form a second composition of the second isolation structure;
   wherein the first isolation structure comprises an oxidation layer and a first nitridation layer formed on the oxidation layer contacting the substrate;
   wherein the second isolation structure comprises a second nitridation layer contacting the substrate.

2. The method of claim 1, wherein the first nitridation layer comprises SixNz, wherein X is greater than 0, and Z is greater than 0.

3. The method of claim 1, wherein the first nitridation layer comprises SixOyNz, wherein X is greater than 0, Y is greater than 0, and Z is greater than 0.

4. The method of claim 3, wherein the second isolation structure is free of nitrogen.

5. The method of claim 1, wherein the second nitridation layer comprises SixNz, wherein X is greater than 0, and Z is greater than 0.

6. The method of claim 1, wherein the second nitridation layer comprises SixOyNz, wherein X is greater than 0, Y is greater than 0, and Z is greater than 0.

7. A method of manufacturing a semiconductor device, comprising:
   providing a substrate;
   forming a first trench within the substrate;
   forming a second trench within the substrate;
   forming an oxidation layer within the first trench;
   after the oxidation layer is formed, forming a first nitridation layer on the oxidation layer contacting the substrate;
   forming a second nitridation layer within the second trench to contact the substrate;
   forming a first isolation layer on the first nitridation layer to form a first isolation structure; and
   forming a second isolation layer on the second nitridation layer to form a second isolation structure.

8. The method of claim 7, wherein forming the first nitridation layer on the oxidation layer comprises reacting the first oxidation layer with a reaction gas to form the first nitridation layer.

9. The method of claim 7, wherein the first nitridation layer comprises SixOyNz, wherein X is greater than 0, Y is greater than 0, and Z is greater than 0, and the second isolation structure is free of nitrogen.

* * * * *